US012772700B2

(12) United States Patent
Kim et al.

(10) Patent No.: US 12,772,700 B2
(45) Date of Patent: Oct. 20, 2026

(54) DISPLAY PANEL AND METHOD OF MANUFACTURING THE SAME

(71) Applicant: Samsung Display Co., Ltd., Yongin-si (KR)

(72) Inventors: Namjin Kim, Yongin-si (KR); Yeonju Seo, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 507 days.

(21) Appl. No.: 18/221,315

(22) Filed: Jul. 12, 2023

(65) Prior Publication Data

US 2024/0122038 A1 Apr. 11, 2024

(30) Foreign Application Priority Data

Oct. 7, 2022 (KR) ........................ 10-2022-0129031

(51) Int. Cl.
*H10K 59/80* (2023.01)
*H10K 59/12* (2023.01)
*H10K 59/122* (2023.01)

(52) U.S. Cl.
CPC ....... *H10K 59/873* (2023.02); *H10K 59/1201* (2023.02); *H10K 59/122* (2023.02)

(58) Field of Classification Search
CPC . H10K 59/873; H10K 59/1201; H10K 59/122
See application file for complete search history.

(56) References Cited

U.S. PATENT DOCUMENTS

| | | | | |
|---|---|---|---|---|
| 9,553,280 | B2 | 1/2017 | Seo et al. | |
| 10,916,728 | B2 | 2/2021 | Park et al. | |
| 11,127,921 | B2 | 9/2021 | Jung | |
| 11,329,120 | B2 | 5/2022 | Kim et al. | |
| 11,462,605 | B2 | 10/2022 | Han et al. | |
| 12,150,364 | B2 * | 11/2024 | Shin | G06F 3/0412 |
| 2018/0151642 | A1 | 5/2018 | Oh | |
| 2019/0245161 | A1 | 8/2019 | Lee et al. | |
| 2020/0144341 | A1 | 5/2020 | Choi et al. | |
| 2022/0020955 | A1 * | 1/2022 | Lee | H10K 50/844 |
| 2022/0131103 | A1 | 4/2022 | Sung et al. | |

FOREIGN PATENT DOCUMENTS

| | | | |
|---|---|---|---|
| KR | 10-2018-0061866 | A | 6/2018 |
| KR | 10-2019-0096471 | A | 8/2019 |
| KR | 10-2020-0003337 | A | 1/2020 |
| KR | 10-2020-0024377 | A | 3/2020 |
| KR | 10-2020-0051075 | A | 5/2020 |
| KR | 10-2021-0017297 | A | 2/2021 |
| KR | 10-2021-0040203 | A | 4/2021 |
| KR | 10-2022-0056924 | A | 5/2022 |

* cited by examiner

*Primary Examiner* — Anne M Hines
(74) *Attorney, Agent, or Firm* — Womble Bond Dickinson (US) LLP

(57) ABSTRACT

A display panel includes: a substrate comprising a display area, an opening area, a middle area, and a peripheral area outside the display area; an inorganic insulating layer on the substrate; a bank on the inorganic insulating layer in the peripheral area; and a metal layer on at least a portion of an upper surface of the bank and on a lateral surface adjacent to the display area among lateral surfaces of the bank, the metal layer comprising a conductive oxide.

20 Claims, 29 Drawing Sheets

DISPLAY PANEL AND METHOD OF MANUFACTURING THE SAME

CROSS-REFERENCE TO RELATED APPLICATION

The present application claims priority to and the benefit of Korean Patent Application No. 10-2022-0129031, filed on Oct. 7, 2022, in the Korean Intellectual Property Office, the entire disclosure of which is incorporated herein by reference.

BACKGROUND

1. Field

Aspects of one or more embodiments relate to a display panel and a method of manufacturing the same.

2. Description of the Related Art

Recently, electronic devices have come into widespread use. Electronic devices are used in a variety of ways and applications, such as mobile electronic devices and fixed electronic devices. In order to support various functions, such electronic devices include a display capable of providing a user with visual information such as images or videos.

Recently, as components for driving such displays have become miniaturized, the area or size of the displays in electronic devices is gradually increasing. Moreover, a structure that may be bent to have a set or predetermined angle from a flat state or may be folded on an axis has been developed.

General display apparatuses include a display panel. The display panel includes a display region that displays images, and a peripheral area that is a non-display region adjacent to or outside the display region. As for such a display apparatus, at least a portion of a peripheral area may be bent so as to improve visibility from various angles or reduce an area of a non-display region.

The above information disclosed in this Background section is only for enhancement of understanding of the background and therefore the information discussed in this Background section does not necessarily constitute prior art.

SUMMARY

In some systems, when reliability of a display panel progresses at high temperature and high humidity, electrodes included in the display panel or at least some of the layers included in the display panel may be oxidized.

Aspects of one or more embodiments include a display panel that may be capable of preventing or reducing oxidation of electrodes included in the display panel or at least some of the layers included in the display panel, and a method of manufacturing the display panel. However, aspects of embodiments according to the disclosure are not limited thereto, and the above characteristics do not limit the scope of embodiments according to the disclosure.

Additional aspects will be set forth in portion in the description which follows and, in part, will be apparent from the description, or may be learned by practice of the presented embodiments of the disclosure.

According to one or more embodiments, a display panel includes a substrate including a display area, an opening area, a middle area, and a peripheral area outside the display area, an inorganic insulating layer on the substrate, a bank on the inorganic insulating layer in the peripheral area, and a metal layer on at least a portion of an upper surface of the bank and a lateral surface adjacent to the display area among lateral surfaces of the bank, the metal layer including a conductive oxide.

According to some embodiments, the display panel may further include a first dam on the inorganic insulating layer in the peripheral area, and the first dam may be between the bank and the display area.

According to some embodiments, the display panel may further include a light-emitting diode on the display area, and an encapsulation layer on the light-emitting diode and comprising a first inorganic encapsulation layer, a second inorganic encapsulation layer on the first inorganic encapsulation layer, and an organic encapsulation layer between the first inorganic encapsulation layer and the second inorganic encapsulation layer. The encapsulation layer may extend from the display area to the peripheral area.

According to some embodiments, the organic encapsulation layer may be interrupted by the first dam.

According to some embodiments, the first inorganic encapsulation layer and the second inorganic encapsulation layer may be discontinuous on the upper surface of the bank.

According to some embodiments, respective lengths of the first and second inorganic encapsulation layers on the upper surface of the bank may be equal to each other.

According to some embodiments, a length of the metal layer on the upper surface of the bank may be equal to each of the respective lengths of the first and second inorganic encapsulation layers on the upper surface of the bank.

According to some embodiments, the length of the metal layer on the upper surface of the bank may be greater than each of the respective lengths of the first and second inorganic encapsulation layers on the upper surface of the bank.

According to some embodiments, the metal layer may be on at least a portion of the inorganic insulating layer exposed between the bank and the first dam.

According to some embodiments, a height from an upper surface of the inorganic insulating layer to the upper surface of the bank may be greater than a height from the upper surface of the inorganic insulating layer to an upper surface of the first dam.

According to some embodiments, the metal layer may include a conductive oxide.

According to some embodiments, the metal layer may include a compound of oxygen (O) and at least one of aluminum (Al), titanium (Ti), or tungsten (W).

According to one or more embodiments, a method of manufacturing a display panel includes preparing for a substrate including a display area, an opening area, a middle area, and a peripheral area outside the display area, forming an inorganic insulating layer on the substrate, forming a bank on the inorganic insulating layer, consecutively covering the substrate with a metal layer forming material, and forming a metal layer on at least a portion of the upper surface of the bank and a lateral surface adjacent to the display area among the lateral surfaces of the bank by patterning the metal layer forming material.

According to some embodiments, the method may further include forming a sacrificial layer on the middle area by patterning the metal layer forming material, after continuously covering the substrate with the metal layer forming material.

According to some embodiments, the forming of the sacrificial layer on the middle area by patterning the metal layer forming material may include continuously forming a first photoresist on the metal layer forming material, removing a portion of the first photoresist located on a portion of the middle area where a groove is to be formed, etching the metal layer forming material not covered by the first photoresist in the middle area, and forming the sacrificial layer by removing the first photoresist.

According to some embodiments, the method may further include forming the groove by etching a first organic insulating layer and a second organic insulating layer in the middle area, after forming the sacrificial layer on the middle area by patterning the metal layer forming material.

According to some embodiments, the forming of the metal layer on the at least a portion of the upper surface of the bank and the lateral surface adjacent to the display area among the lateral surfaces of the bank may include continuously covering the substrate with a second photoresist, removing the second photoresist on a portion of the substrate excluding the at least a portion of the upper surface of the bank and the lateral surface adjacent to the display area among the lateral surfaces of the bank, etching the metal layer forming material not covered with the second photoresist, and removing the second photoresist to form the metal layer.

According to some embodiments, the metal layer may include a conductive oxide.

According to some embodiments, the metal layer may include a compound of oxygen (O) and at least one of aluminum (Al), titanium (Ti), or tungsten (W).

According to some embodiments, the forming of the bank on the inorganic insulating layer may include forming the bank by patterning the first organic insulating layer, the second organic insulating layer, a pixel defining layer, or a spacer on the inorganic insulating layer.

BRIEF DESCRIPTION OF THE DRAWINGS

The above and other aspects, features, and characteristics of certain embodiments of the disclosure will be more apparent from the following description taken in conjunction with the accompanying drawings, in which.

DETAILED DESCRIPTION

Figure 1:
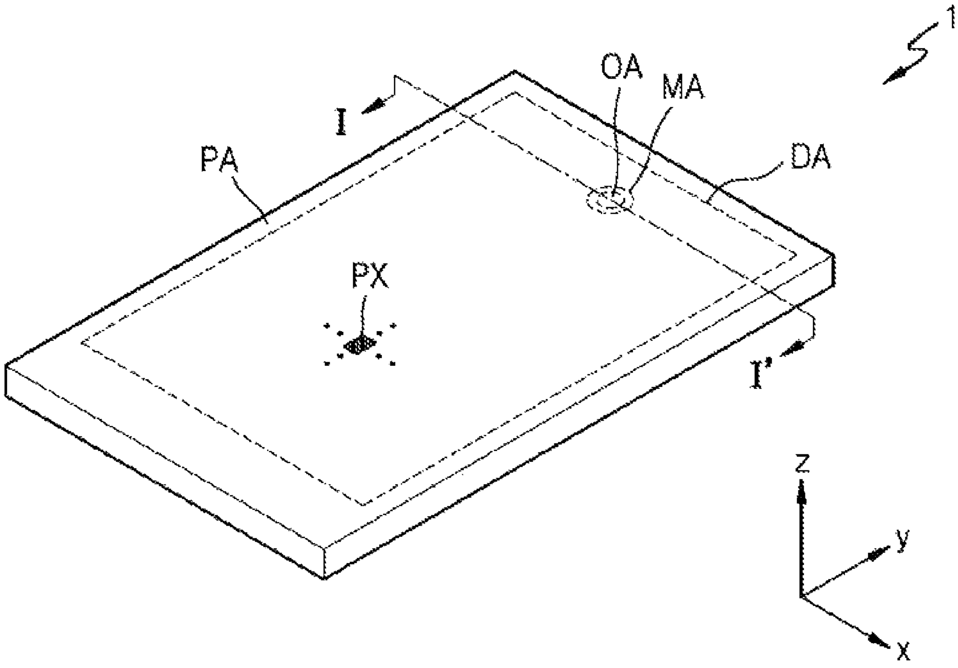
FIG. 1 is a schematic perspective view of a display device according to some embodiments.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the disclosure allows for various changes and numerous embodiments, particular embodiments will be illustrated in the drawings and described in detail in the written description. Hereinafter, effects and features of the disclosure and a method for accomplishing them will be described more fully with reference to the accompanying drawings, in which embodiments of the present disclosure are shown. The disclosure may, however, be embodied in many different forms and should not be construed as limited to the embodiments set forth herein.

One or more embodiments of the disclosure will be described below in more detail with reference to the accompanying drawings. Those components that are the same as or are in correspondence with each other are rendered the same reference numeral regardless of the figure number, and redundant explanations are omitted.

It will be understood that although the terms "first," "second," etc. may be used herein to describe various components, these components should not be limited by these terms. These components are only used to distinguish one component from another.

As used herein, the singular forms "a," "an," and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on" another layer, region, or component, it can be directly or indirectly formed on the other layer, region, or component. That is, for example, intervening layers, regions, or components may be present.

Sizes of elements in the drawings may be exaggerated for convenience of explanation. For example, since sizes and thicknesses of components in the drawings are arbitrarily illustrated for convenience of explanation, embodiments of the disclosure are not limited thereto.

When a certain embodiment may be implemented differently, a specific process order may be performed differently from the described order. For example, two consecutively described processes may be performed substantially at the same time or performed in an order opposite to the described order.

In the present specification, "A and/or B" represents A or B, or A and B. The expression "at least one of A and B" indicates only A, only B, both A and B, or variations thereof.

It will also be understood that when a layer, region, or component is referred to as being "connected" or "coupled" to another layer, region, or component, it can be directly connected or coupled to the other layer, region, or/and component or intervening layers, regions, or components may be present. For example, when a layer, region, or component is referred to as being "electrically connected" or "electrically coupled" to another layer, region, or component, it can be directly electrically connected or coupled to the other layer, region, and/or component or intervening layers, regions, or components may be present.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

FIG. 1 is a schematic perspective view of a display apparatus 1 according to some embodiments.

According to some embodiments, the display apparatus 1 displays moving pictures (e.g., video images) or still images (e.g., static images), and thus may be used as the display screens of various products such as not only portable apparatuses, such as mobile phones, smartphones, tablet personal computers (PCs), mobile communication terminals, electronic notebooks, electronic books, portable multimedia players (PMPs), navigation devices, and ultra mobile PCs (UMPCs) but also televisions, notebooks, monitors, advertisement panels, and Internet of things (IoT) devices.

According to some embodiments, the display apparatus 1 may also be used in wearable devices such as smart watches, watch phones, glasses-type displays, and head mounted displays (HMDs). According to some embodiments, the display apparatus 1 may also be used as dashboards of automobiles, center information displays (CIDs) of the center fasciae or dashboards of automobiles, room mirror displays that replace the side mirrors of automobiles, and displays arranged on the rear sides of front seats to serve as entertainment devices for back seat passengers of automobiles. For convenience of explanation, FIG. 1 illustrates use of a smartphone as the display apparatus 1.

Referring to FIG. 1, the display apparatus 1 may include an opening area OA, and a display area DA surrounding the opening area OA. The display apparatus 1 may include a middle area MA between the opening area OA and the display area DA, and a peripheral area PA outside the display area DA, for example, surrounding the display area DA. The middle area MA may have a closed loop shape that surrounds the entire opening area OA, in a plan view.

The opening area OA may be arranged inside the display area DA. According to some embodiments, the opening area OA may be arranged at the center of an upper portion of the display area DA as illustrated in FIG. 1. Alternatively, the opening area OA may be arranged in various ways, such as, being arranged on a left upper portion of the display area DA or a right upper portion of the display area DA. In FIG. 1, one open area OA is located. However, according to some embodiments, a plurality of open areas OA may be provided.

Figure 7:
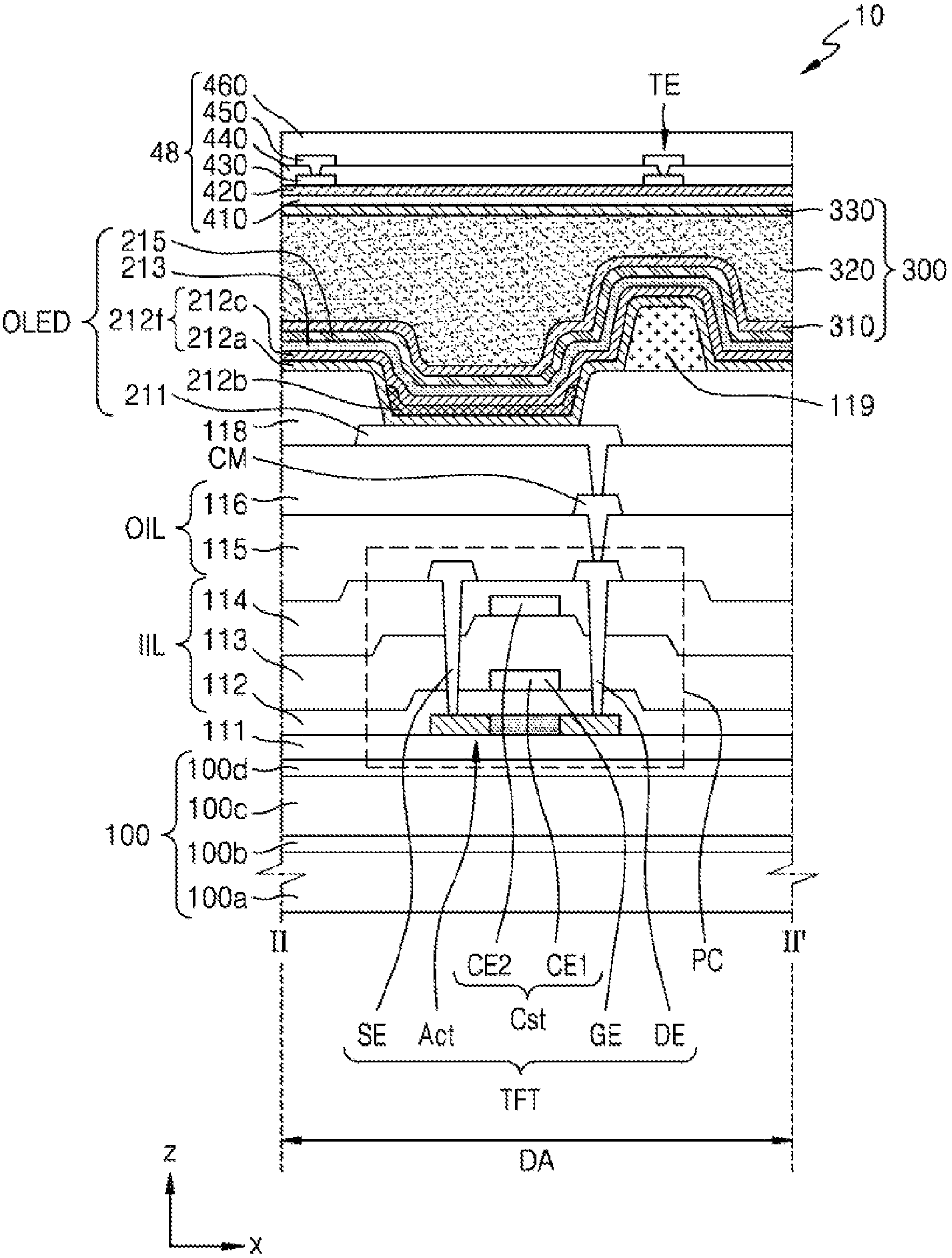
FIG. 7 is a schematic cross-sectional view of a display panel according to some embodiments.

Although the display area DA has an approximately rectangular shape in FIG. 7, embodiments according to the present disclosure are not limited thereto. The display area DA may have any of various shapes, for example, a circular shape, an elliptical shape, and a polygonal shape.

On the display area DA, which displays an image, a plurality of subpixels PX may be arranged. Each of the subpixels PX may include a display element such as an organic light-emitting diode. Each of the subpixels PX may emit, for example, red light, green light, blue light, or white light.

The display area DA may display images by using light emitted by the subpixels PX. The subpixel PX used herein may be defined as a light-emission area that emits one of red light, green light, blue light, or white light as described above. The peripheral area PA may be an area where no subpixels PX are arranged, and may correspond to an area where no images are provided.

An organic light-emitting display apparatus will now be illustrated and described as the display apparatus 1 according to some embodiments. However, the display apparatus 1 according to embodiments of the present disclosure are not limited thereto. For example, the display apparatus 1 according to embodiments of the present disclosure may be an inorganic light-emitting display, a quantum dot light-emitting display, or the like. For example, an emission layer of a display element included in the display apparatus 1 may include an organic material or may include an inorganic material. Quantum dots may be located on the path of light emitted by the emission layer.

Figure 2:
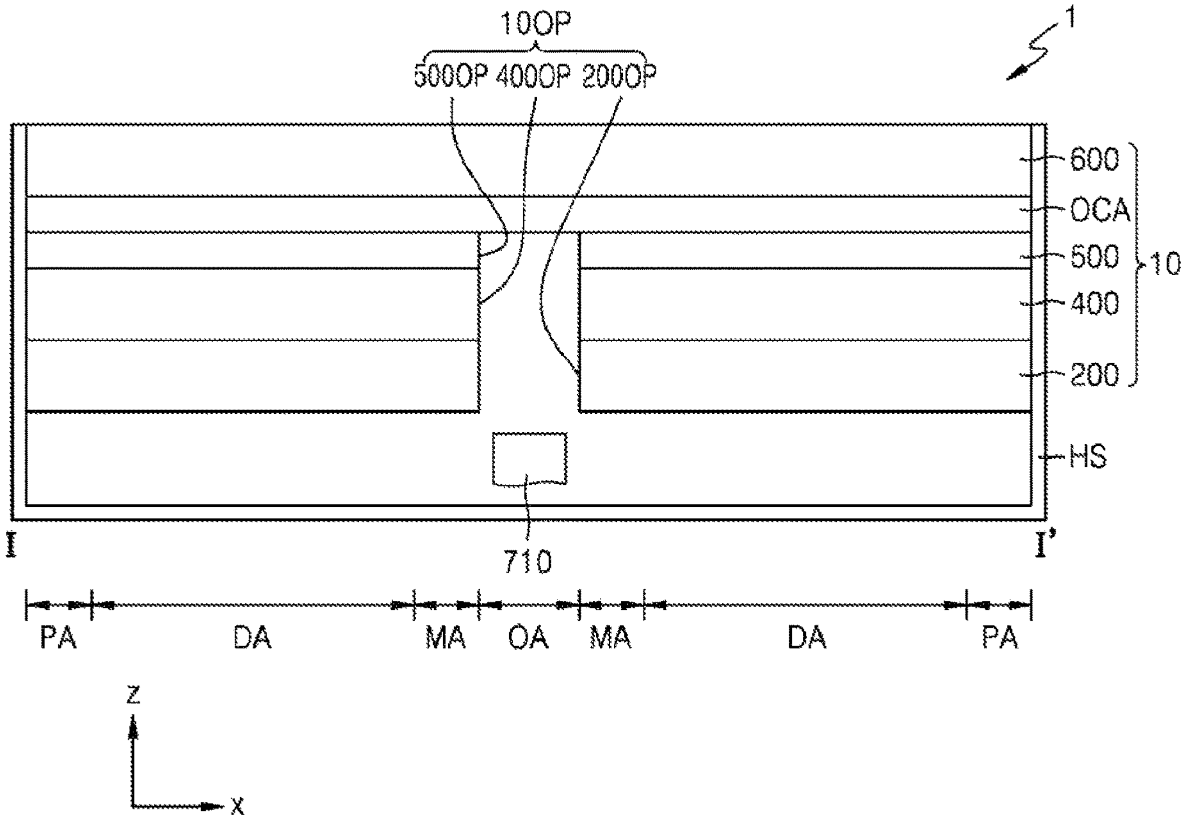
FIG. 2 is a schematic cross-sectional view of a display apparatus according to some embodiments.

FIG. 2 is a schematic cross-sectional view of the display apparatus 1 according to some embodiments, which is taken along the line I-I' of FIG. 1.

Referring to FIG. 2, the display apparatus 1 may include a display panel 10 and a component 710. According to some embodiments, the component 710 may be located under (or below) the display panel 10 and may overlap at least a portion of the opening area OA. The display panel 10 and the component 710 may be accommodated in a housing HS.

The display panel 10 may include an image generation layer 200, a touch sensor layer 400, an optical functional layer 500, and a cover window 600.

The image generation layer 200 may include display elements that emit light to display an image. Each display element may include a light-emitting diode, for example, an organic light-emitting diode including an organic emission layer.

The touch sensor layer 400 may obtain coordinate information based on an external input, for example, a touch event. The touch sensor layer 400 may include a sensing electrode (or a touch electrode) and trace lines connected to the sensing electrode. The touch sensor layer 400 may be located on the image generation layer 200. The touch sensor layer 400 may sense an external input according to a mutual cap method and/or a self cap method.

The touch sensor layer 400 may be directly formed on the image generation layer 200, or may be formed separately and then coupled to the image generation layer 200 by using an adhesive layer such as an optical clear adhesive (OCA). For example, the touch sensor layer 400 may be formed right after the image generation layer 200 is formed. In this case, the adhesion layer may not be provided between the touch sensor layer 400 and the image generation layer 200. FIG. 2 shows that the touch sensor layer 400 is between the image generation layer 200 and the optical functional layer 500. However, according to some embodiments, the touch sensor layer 400 may be on the optical functional layer 500.

The optical functional section 500 may include an anti-reflection layer. The anti-reflection layer may reduce reflectivity of light (external light) incident from an external source toward the display panel 10 through the cover window 600. The anti-reflection layer may include a phase retarder and a polarizer. According to some embodiments, the anti-reflection layer may include a black matrix and color filers. The color filters may be arranged by taking into account the colors of light beams respectively emitted by the light-emitting diodes of the image generation layer 200.

To improve transmittance of the opening area OA, the display panel 10 may include an opening 10OP penetrating through some of the layers constituting the display panel 10. The opening 10OP may include openings 200OP, 400OP, and 500OP that penetrate through the image generation layer

200, the touch sensor layer 400, and the optical functional layer 500, respectively. The opening 200OP of the image generation layer 200, the opening 400OP of the touch sensor layer 400, and the opening 500OP of the optical functional layer 500 may overlap one another to form the opening 100OP of the display panel 10.

The cover window 600 may be arranged on the optical functional layer 500. The cover window 600 may be coupled to the optical functional layer 500 via the adhesive layer, such as an OCA. The cover window 600 may cover the opening 200OP of the image generation layer 200, the opening 400OP of the touch sensor layer 400, and the opening 500OP of the optical functional layer 500. According to some embodiments, the OCA and/or the cover window 600 may also include an opening.

The cover window 600 may include a glass material or a plastic material. The glass material may include ultra-thin glass. The plastic material may include polyethersulfone, polyacrylate, polyetherimide, polyethylene naphthalate, polyethylene terephthalate, polyphenylene sulfide, polyarylate, polyimide, polycarbonate, cellulose acetate propionate, or the like.

The opening area OA may be a kind of component area (e.g. a sensor area, a camera area, a speaker area, or the like) in which the component 710 for adding various functions to the display apparatus 1 is located.

The component 710 may include an electronic element. For example, the component 710 may be an electronic element that uses light or sounds. For example, the electronic element may include a sensor using light, like an infrared sensor, a camera that receives light and captures an image, a sensor that outputs and senses light or sound to measure a distance or recognize a fingerprint or the like, a small lamp that outputs light, or a speaker that outputs sound. An electronic element using light may use light in various wavelength bands, such as visible light, infrared light, and ultraviolet light. The opening area OA corresponds to an area capable of transmitting light or/and sound that is output from the component 710 to the outside or travels from the outside toward the electronic element.

Figure 3:
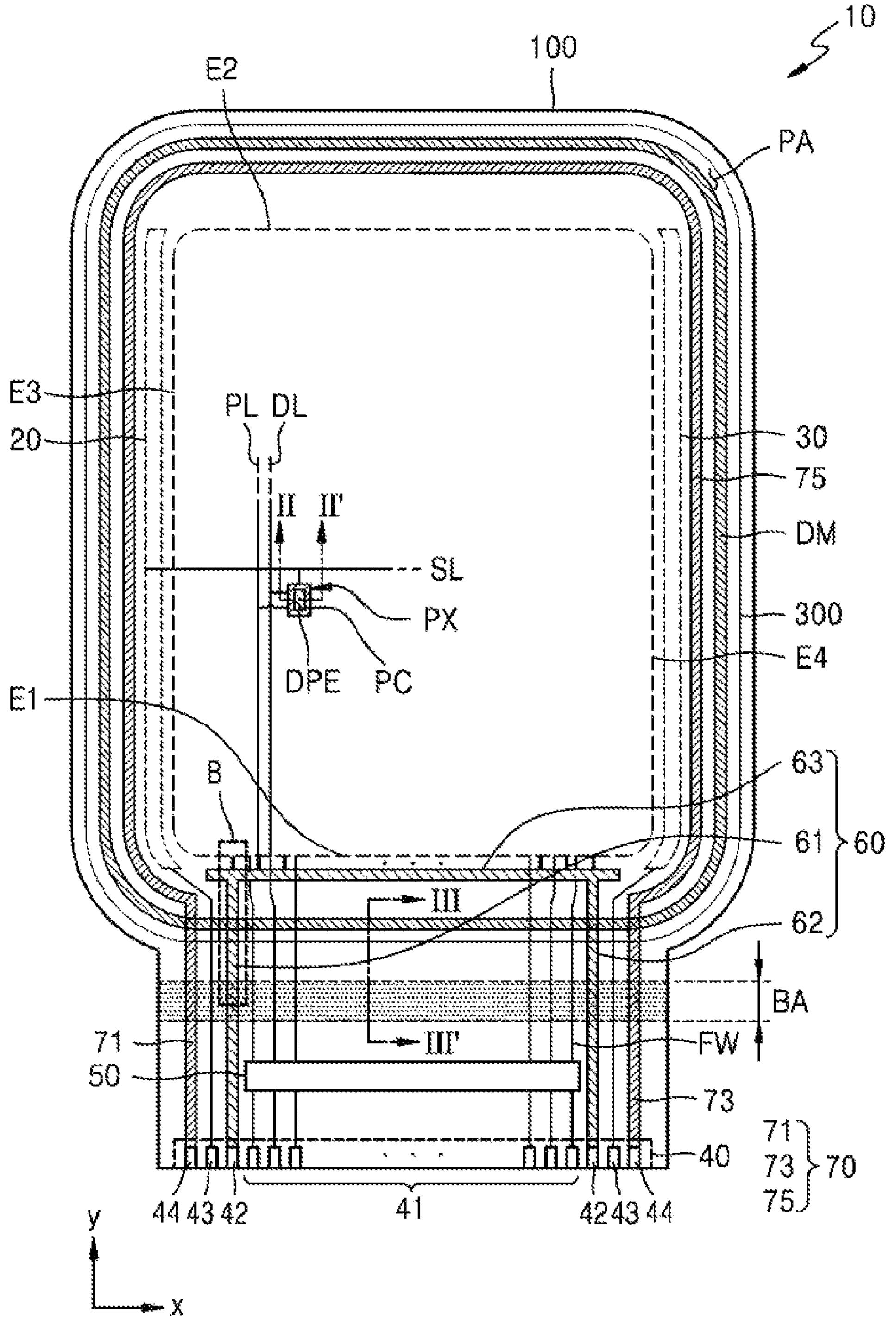
FIG. 3 is a schematic plan view of a display panel according to some embodiments.

FIG. 3 is a schematic plan view of the display panel 10 according to some embodiments.

Referring to FIG. 3, the display panel 10 may include first and second scan driving units 20 and 30, a terminal portion 40, a data driving unit 50, and a power supply line arranged on a substrate 100. The power supply line may include a driving voltage supply line 60 and a common voltage supply line 70.

The substrate 100 may include the display area DA and the peripheral area PA surrounding the display area DA. A portion of the peripheral area PA may extend to one side (e.g., a y direction). The terminal portion 40, the data driving unit 50, the driving voltage supply line 60, and the like may be arranged on the extending peripheral area PA. According to some embodiments, a width of the extended peripheral area PA in the x-direction may be less than that of the display area DA. The substrate 100 may include a bending area BA in which a portion of the peripheral area PA bends. As the peripheral area PA extending based on the bending area BA is folded, the extending peripheral area PA may partially overlap the display area DA. Through this structure, even when the extending peripheral area PA is not visually recognized or is visually recognized by a user, a visually recognized area may be minimized or reduced.

A plurality of subpixels PX may be arranged on the display area DA. Each of the subpixels PX may be implemented by a display element DPE, such as an organic light-emitting diode. Each of the subpixels PX may emit, for example, red light, green light, blue light, or white light.

Each of subpixel circuits PC driving the subpixels PX on the display area DA may be connected to a trace line or voltage line for controlling an on/off operation and a luminance of the display element DPE, for example, a light-emitting diode. For example, FIG. 3 shows scan lines SL extending in a first direction (e.g., an x direction) and data lines DL extending in a second direction (e.g., a y direction) as trace lines, and shows driving voltage lines PL as voltage lines.

The subpixel circuits PC driving the subpixels PX may be electrically connected to outer circuits arranged in the peripheral area PA, respectively. In the peripheral area PA, the first and second scan driving units 20 and 30, the terminal portion 40, the data driving circuit 50, the driving voltage supply line 60, and the common voltage supply line 70 may be arranged.

The first scan driving unit 20 and the second scan driving unit 30 may generate and transmit a scan signal to each of the subpixels PC via a scan line SL. According to some embodiments, the first scan driving unit 20 or the second scan driving unit 30 may apply a light-emission control signal to each of the subpixels PC via a light-emission control line. According to some embodiments, the first and second scan driving units 20 and 30 are arranged on both sides of the display 10, respectively. However, according to some embodiments, a scan driving unit may be arranged on only one side of the display area DA. The second scan driving unit 30 may be arranged symmetrically with the first scan driving unit 20 about the display area DA.

The data driving unit 50 generates and transmits a data signal to each of the subpixel circuits PC via a data line DL. The data driving unit 50 may be arranged on one side of the display area DA, and may be arranged in the extending peripheral area PA below the display area DA (e.g., in the y direction). FIG. 3 illustrates arrangement of the data driving unit 50 on the substrate 100. However, according to some embodiments, the data driving unit 50 may be included on a flexible printed circuit board (PCB) that contacts the terminal portion 40.

The terminal portion 40 is located on one end of the substrate 100 and includes a plurality of terminals 41, 42, 43, and 44. The terminal portion 40 may be exposed without being covered with an insulating layer, and may be electrically connected to a controller such as a flexible PCB or an integrated circuit (IC) chip. Control signals of the controller may be provided to the first scan driving unit 20, the second scan driving unit 30, the data driver 50, the driving voltage supply line 60, and the common voltage supply line 70, respectively, via the terminal portion 40.

The driving voltage supply line 60 may be arranged in the peripheral area PA. The driving voltage supply line 60 may provide a driving voltage ELVDD to each of the subpixels PX. According to some embodiments, the driving voltage supply line 60 may include a first driving voltage supply line 61, a second driving voltage supply line 62, and a third driving voltage supply line 63. The third driving voltage supply line 63 may extend in the first direction (e.g., the x direction), and the first and second driving voltage supply lines 61 and 62 may extend in the second direction (e.g., the y direction). For example, the third driving voltage supply line 63 may be arranged along a first edge E1 of the display area DA. According to some embodiments, the first driving voltage supply line 61, the second driving voltage supply line 62, and the third driving voltage supply line 63 may be integrally formed with one another. For example, the driving voltage supply line 60 may have a 'Π' (pie) shape (e.g., with a horizontal section (driving voltage supply line 63), and two vertical sections (e.g., the driving voltage supply lines 61 and 62) intersecting the horizontal section). However, embodiments according to the present disclosure is not limited thereto.

The driving voltage supply line 60 may be arranged in the peripheral area PA, and may be connected to the plurality of driving voltage lines PL each extending to the display area DA in the second direction (e.g., the y direction). For example, the third driving voltage supply line 63 may be connected to the driving voltage line PL extending across the display area DA in the second direction (e.g., the y direction).

The common voltage supply line 70 may be arranged in the peripheral area PA, and may provide a common voltage ELVSS to each of the subpixels PX. The common voltage supply line 70 may include a first common voltage supply line 71 and a second common voltage supply line 73 arranged to be adjacent to the first edge E1 of the display area DA. The first common voltage supply line 71 and the second common voltage supply line 73 may extend in the second direction (for example, the y direction). The first common voltage supply line 71 and the second common voltage supply line 73 may be arranged apart from each other in the first direction (for example, the x direction) intersecting the second direction (for example, the y direction). The first common voltage supply line 71 and the second common voltage supply line 73 may be arranged on both sides of the first edge E1 of the display area DA, respectively. However, the disclosure is not limited thereto. The common voltage supply line 70 may further include a third common voltage supply line arranged between the first common voltage supply line 71 and the second common voltage supply line 73. When the common voltage supply line 70 further includes the third common voltage supply line arranged between the first common voltage supply line 71 and the second common voltage supply line 73, a current density upon current application may be lowered and heat generation may be suppressed, compared to when the common voltage supply line 70 includes only the first common voltage supply line 71 and the second common voltage supply line 73.

The first common voltage supply line 71 and the second common voltage supply line 73 may be connected to each other by a body unit 75 extending along a second edge E2, a third edge E3, and a fourth edge E4 of the display area DA. According to some embodiments, the first common voltage supply line 71, the second common voltage supply line 73, and the body unit 75 may be integrally formed with one another.

A dam DM may be arranged in the peripheral area PA. The dam DM may be arranged to surround the display area DA. The dam DM may be arranged outside the common voltage supply line 70 or may be arranged to partially overlap the common voltage supply line 70.

In the display area DA, an encapsulation layer 300 is arranged to cover the subpixels PX. A portion of the encapsulation layer 300 may extend to the peripheral area PA. The encapsulation layer 300 has a multi-layer structure including at least one organic encapsulation layer and at least one inorganic encapsulation layer, and the dam DM may prevent an organic encapsulation layer forming material included in the encapsulation layer 300 from being diffused toward the edge of the substrate 100, and may limit a formation position of the at least one organic encapsulation layer.

Figure 4:
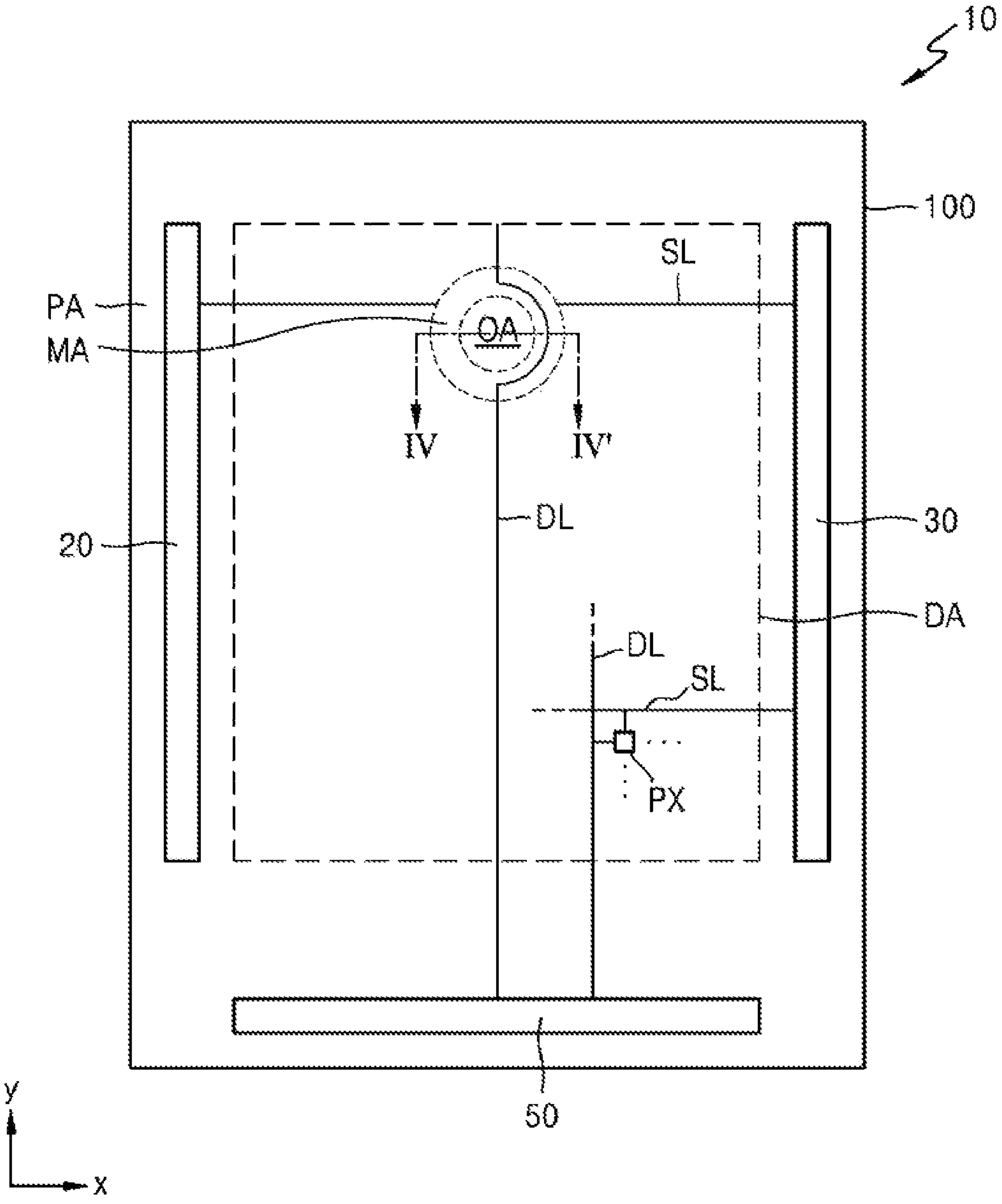
FIG. 4 is a schematic plan view of a display panel according to some embodiments.

FIG. 4 is a schematic plan view of the display panel 10 according to some embodiments.

Referring to FIG. 4, according to some embodiments, the display panel 10 may include the opening area OA, the display area DA, the middle area MA, and the peripheral area PA.

As described above, the first scan driving unit 20 and the second scan driving unit 30 may be respectively arranged on both sides of the display area DA with the display area DA therebetween. In this case, subpixels PX arranged on the left side of the opening area OA may be connected to the first scan driving unit 20 located on the left side, and subpixels arranged on the right side of the opening area OA may be connected to the second scan driving unit 30 located on the right side.

The middle area MA may surround the opening area OA. The middle area MA is an area in which a display element such as an organic light-emitting diode is not arranged. Trace lines configured to provide signals to subpixels PX arranged around the opening area OA may traverse the middle area MA. For example, the data lines DL and/or the scan lines SL may extend across the display area DA, and respective portions of the data lines DL and/or the scan lines SL may bypass the middle area MA along the edge of the opening 10OP of the display panel 10 formed in the opening area OA. According to some embodiments, FIG. 4 shows that the data lines DL extend across the display area DA in the y-direction, but some of the data lines DL bypass the opening area OA to partially surround the opening area OA in the middle area MA. The scan lines SL extend across the display area DA in the x direction, and may be spaced apart from one another with the opening area OA therebetween. In other words, scan lines SL on the same row may be discontinuous (or disconnected or broken up) with the opening area OA) around the opening area OA.

Figure 5:
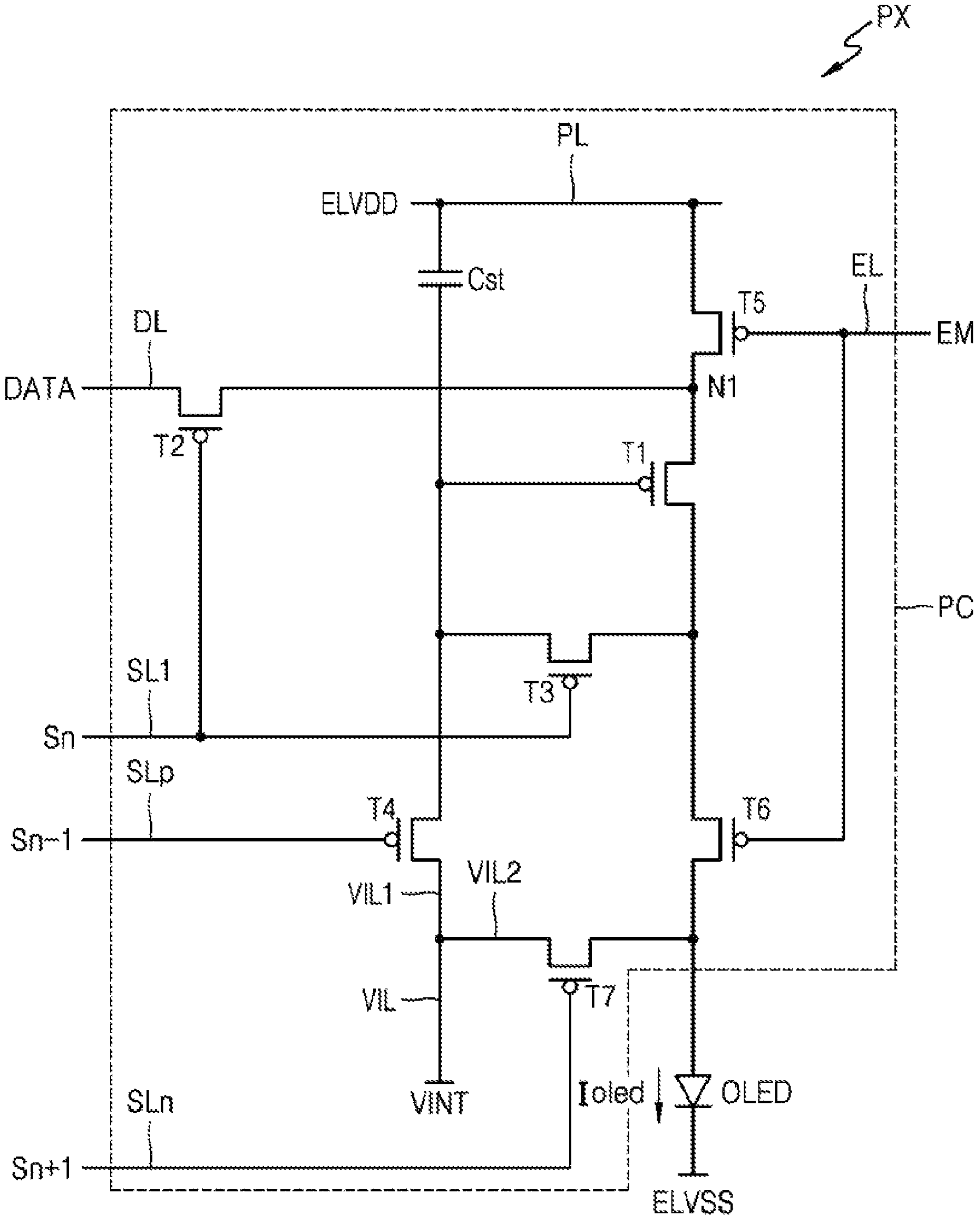
FIGS. 5 and 6 are equivalent circuit diagrams schematically illustrating a display element and a subpixel circuit electrically connected thereto in a display apparatus according to some embodiments.
Figure 6:
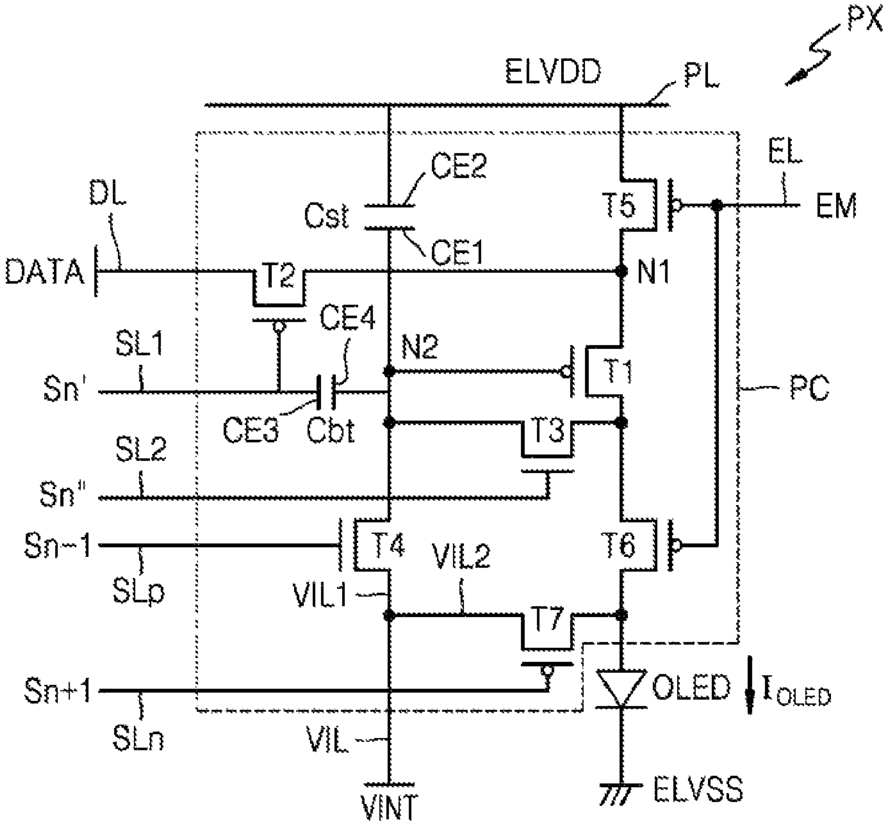

FIGS. 5 and 6 are equivalent circuit diagrams schematically illustrating a display element and a subpixel circuit electrically connected thereto in a display apparatus according to some embodiments.

Referring to FIG. 5, one subpixel PX may include a subpixel circuit PC, and an organic light-emitting diode OLED as a display element DPE electrically connected to the subpixel circuit PC.

For example, the subpixel circuit PC may include a plurality of thin-film transistors T1 through T7 and a capacitor Cst. The plurality of thin-film transistors T1 through T7 may include a driving transistor T1, a switching transistor T2, a compensating transistor T3, a first initializing transistor T4, an operation control transistor T5, an emission control transistor T6, and a second initializing transistor T7. However, embodiments according to the present disclosure are not limited thereto.

The organic light-emitting diode OLED may include a subpixel electrode and an opposite electrode, the subpixel electrode of the organic light-emitting diode OLED may be connected to the driving transistor T1 via the emission control transistor T6 to receive a driving current, and the opposite electrode of the organic light-emitting diode OLED may receive the common voltage ELVSS. The organic light-emitting diode OLED may generate light of brightness corresponding to the driving current.

According to some embodiments, all of the plurality of thin-film transistors T1 through T7 may be PMOS transistors. The plurality of thin-film transistors T1 through T7 may include amorphous silicon or polysilicon.

The trace lines may include a first scan line SL1, a previous scan line SLp, a next scan line SLn, an emission control line EL, and a data line DL. However, the disclosure is not limited thereto.

The first scan line SL1 may transmit a first scan signal Sn. The previous scan line SLp may transmit a previous scan signal Sn−1 to the first initializing transistor T4. The next scan line SLn may transmit a next scan signal Sn+1 to the second initializing transistor T7. The emission control line EL may transmit an emission control signal EM to the operation control transistor T5 and the light-emission control transistor T6. The data line DL may transmit a data signal DATA.

The driving voltage line PL may transmit the driving voltage ELVDD to the driving transistor T1. The initializing voltage line VIL may transmit an initializing voltage VINT that initializes the driving transistor T1 and the organic light-emitting diode OLED. In detail, a first initializing voltage line VIL1 may transmit the initializing voltage VINT to the first initializing transistor T4, and a second initializing voltage line VIL2 may transmit the initializing voltage VINT to the second initializing transistor T7.

A driving gate electrode of the driving transistor T1 may be connected to the capacitor Cst, and one of a source region and a drain region of the driving transistor T1 may be connected to the driving voltage line PL through a first node N1 via the operation control transistor T5, and the other of the source region and the drain region of the driving transistor T1 may be electrically connected to the subpixel electrode of the organic light-emitting diode OLED via the emission control transistor T6. The driving transistor T1 may receive the data signal DATA according to a switching operation of the switching transistor T2 and may supply a driving current Ioled to the organic light-emitting diode OLED.

A switching gate electrode of the switching transistor T2 may be connected to the first scan line SL1 configured to transmit the first scan signal Sn, one of a source region and a drain region of the switching transistor T2 may be connected to the data line DL, and the other of the source region and the drain region of the switching transistor T2 may be connected to the driving transistor T1 through the first node N1 and also connected to the driving voltage line PL via the operation control transistor T5. The switching transistor T2 may be turned on in response to the first scan signal Sn received through the first scan line SL1, to perform a switching operation of transmitting the data signal DATA received through the data line DL to the driving transistor T1 through the first node N1.

A compensating gate electrode of the compensating transistor T3 may be connected to the first scan line SL1. One of a source region and a drain region of the compensating transistor T3 may be connected to the subpixel electrode of the organic light-emitting diode OLED via the emission control transistor T6. The other of the source region and the drain region of the compensating transistor T3 may be connected to the capacitor Cst and the driving gate electrode of the driving transistor T1. The compensating transistor T3 may be turned on in response to the first scan signal Sn received through the first scan line SL1, to diode-connect the driving transistor T1.

A first initializing gate electrode of the first initializing transistor T4 may be connected to the previous scan line SLp. One of a source region and the drain region of the first initializing transistor T4 may be connected to the first initializing voltage line VIL1. The other of the source region and the drain region of the first initializing transistor T4 may be connected to a first capacitor electrode CE1 of the capacitor Cst and the driving gate electrode of the driving transistor T1. The first initializing transistor T4 may be turned on in response to the previous scan signal Sn−1 received through the previous scan line SLp, to perform an initialization operation of initializing the voltage of the driving gate electrode of the driving transistor T1 by transmitting the initializing voltage VINT to the driving gate electrode of the driving transistor T1.

An operation control gate electrode of the operation control transistor T5 may be connected to the emission control line EL, one of a source region and a drain region of the operation control transistor T5 may be connected to the driving voltage line PL, and the other may be connected to the driving transistor T1 and the switching transistor T2 through the first node N1.

An emission control gate electrode of the emission control transistor T6 may be connected to the emission control line EL, one of a source region and a drain region of the emission control transistor T6 may be connected to the driving transistor T1 and the compensating transistor T3, and the other of the source region and the drain region of the emission control transistor T6 may be electrically connected to the subpixel electrode of the organic light-emitting diode OLED.

The operation control transistor T5 and the emission control transistor T6 are simultaneously (or concurrently) turned on according to the emission control signal EM received via the emission control line EL, and thus the driving voltage ELVDD is transmitted to the organic light-emitting diode OLED such that the driving current Ioled may flow in the organic light-emitting diode OLED.

A second initialization gate electrode of the second initializing transistor T7 may be connected to the next scan line SLn, one of a source region and a drain region of the second initializing transistor T7 may be connected to the subpixel electrode of the organic light-emitting diode OLED, and the other of the source region and the drain region of the second initializing transistor T7 may be connected to the second initializing voltage line VIL2 to receive the initializing voltage VINT. The second initializing transistor T7 may be turned on in response to the next scan signal Sn+1 received via the next scan line SLn to initialize the subpixel electrode of the organic light-emitting device OLED. The next scan line SLn may be the same as the first scan line SL1. In this case, a scan line may function as the first scan line SL1 or as the next scan line SLn by transmitting the same electrical signal with a time difference. According to some embodiments, the second initializing transistor T7 may not be included.

The capacitor Cst may be connected to the driving voltage line PL and the driving gate electrode of the driving transistor T1 to store and maintain a voltage corresponding to a difference between the voltage of the driving voltage line PL and the voltage of the driving gate electrode of the driving transistor T1, thereby maintaining a voltage applied to the driving gate electrode of the driving transistor T1.

Aspects of some operations of the subpixel circuit PC and the organic light-emitting diode OLED as a display element, according to some embodiments, will now be described in more detail.

During an initialization period, when the previous scan signal Sn−1 is supplied via the previous scan line SLp, the first initializing transistor T4 may be turned on in response to the previous scan signal Sn−1, and the driving transistor T1 may be initialized by the initializing voltage VINT supplied from the first initializing voltage line VIL1.

During a data programming period, when the first scan signal Sn is supplied via the first scan line SL1, the switching transistor T2 and the compensating transistor T3 may be turned on in response to the first scan signal Sn. At this time, the driving transistor T1 may be diode-connected by the turned-on compensating transistor T3 and may be biased in a forward direction. Then, a compensating voltage DATA+Vth (where Vth has a negative value) obtained by subtracting a threshold voltage Vth of the driving transistor T1 from the data signal DATA supplied from the data line DL may be applied to the driving gate electrode of the driving transistor T1. The driving voltage ELVDD and the compensating voltage DATA+Vth may be applied to both ends of the capacitor Cst, and a charge corresponding to a voltage difference between both ends may be stored in the capacitor Cst.

During a light emission period, the operation control transistor T5 and the emission control transistor T6 may be turned on by the emission control signal EM supplied from the emission control line EL. The driving current may be generated according to the voltage difference between the first power voltage ELVDD and the voltage of the driving gate electrode of the driving transistor T1, and the driving current Ioled may be supplied to the organic light-emitting diode OLED through the emission control transistor T6.

Referring to FIG. 6, the subpixel circuit PC of the subpixel PX may include a plurality of thin-film transistors T1 through T7, a first capacitor Cst, a second capacitor Cbt, and an organic light-emitting diode OLED as a display element.

Some of the plurality of thin-film transistors T1 through T7 may be n-channel metal oxide semiconductor (NMOS) transistors, e.g., NMOS field effect transistors (N-MOSFETs), and the others may be p-channel metal oxide semiconductor (PMOS) transistors, e.g., PMOS field effect transistors (P-MOSFETs). For example, as shown in FIG. 6, among the plurality of thin-film transistors T1 through T7, the compensating transistor T3 and the first initializing transistor T4 may be NMOS transistors and the others may be PMOS transistors. Alternatively, among the plurality of thin-film transistors T1 through T7, the compensating transistor T3, the first initializing transistor T4, and the second initializing transistor T7 may be NMOS transistors and the others may be PMOS transistors. Alternatively, all of the plurality of thin-film transistors T1 through T7 may be NMOS transistors. The plurality of thin-film transistors T1 through T7 may include amorphous silicon or polysilicon. In some case, an NMOS transistor may include an oxide semiconductor.

The signal lines may include a first scan line SL1 configured to transmit a first scan signal Sn', a second scan line SL2 configured to transmit a second scan signal Sn", a previous scan line SLp configured to transmit a previous scan signal Sn−1 to a first initializing transistor T4, an emission control line EL configured to transmit an emission control signal EM to an operation control transistor T5 and an emission control transistor T6, a next scan line SLn configured to transmit a next scan signal Sn+1 to the second initializing transistor T7, and a data line DL configured to transmit a data signal DATA.

The driving transistor T1 may be connected to a power supply voltage line PL through the operation control transistor T5, and may be electrically connected to the organic light-emitting diode OLED through the emission control transistor T6. The driving transistor T1 may receive the data signal DATA according to a switching operation of the switching transistor T2 and may supply a driving current Ioled to the organic light-emitting diode OLED.

The switching transistor T2 may be connected to the first scan line SL and the data line DL, and may be connected to the power supply voltage line PL via the operation control transistor T5. The switching transistor T2 may be turned on in response to the first scan signal Sn' received through the first scan line SL1, to perform a switching operation of transmitting the data signal DATA received through the data line DL to a first node N1.

The compensating transistor T3 is connected to the second scan line SL2 and is connected to the organic light-emitting diode OLED via the emission control transistor T6. The compensating transistor T3 may be turned on in response to the second scan signal Sn" received through the second scan line SL2 to diode-connect the driving transistor T1, thereby compensating for a threshold voltage of the driving transistor T1.

The first initializing transistor T4 is connected to the previous scan line SLp and a first initializing voltage line VIL1, and is turned on in response to the previous scan signal Sn−1 received through the previous scan line SLp to transmit an initializing voltage VINT from the first initializing voltage line VIL1 to a gate electrode of the driving transistor T1, thereby initializing the voltage of the gate electrode of the driving transistor T1.

The operation control transistor T5 and the emission control transistor T6 may be connected to the emission control line EL, and may be simultaneously (or concurrently) turned on according to the emission control signal EM received through the emission control line EL and thus form a current path so that the driving current IDLED flows from the power supply voltage line PL to the organic light-emitting diode OLED.

The second initializing transistor T7 is connected to the next scan line SLn and a second initializing voltage line VIL2, and is turned on in response to the next scan signal Sn+1 received through the next scan line SLn to transmit the initializing voltage VINT from the second initializing voltage line VIL2 to the organic light-emitting diode OLED, thereby initializing the organic light-emitting diode OLED. The second initializing transistor T7 may not be included.

The first capacitor Cst includes a first capacitor electrode CE1 and a second capacitor electrode CE2. The first capacitor electrode CE1 may be connected to the gate electrode of the driving transistor T1, and the second capacitor electrode CE2 may be connected to the power supply voltage line PL. The first capacitor Cst may maintain a voltage applied to the gate electrode of the driving transistor T1 by storing and maintaining a voltage corresponding to a difference between the voltage of the power supply voltage line PL and the voltage of the gate electrode of the driving transistor T1.

The second capacitor Cbt includes a third capacitor electrode CE3 and a fourth capacitor electrode CE4. The third capacitor electrode CE3 may be connected to the first scan line SL1 and a gate electrode of the switching transistor T2. The fourth capacitor electrode CE4 may be connected to the gate electrode of the driving transistor T1 and the first capacitor electrode CE1 of the first capacitor Cst. The second capacitor Cbt is a boosting capacitor, and, when the first scan signal Sn of the first scan line SL1 is a voltage that turns off the switching transistor T2, the second capacitor Cbt may clearly express a black grayscale by increasing the voltage of a second node N2.

According to some embodiments, at least one of the plurality of transistors T1, T2, T3, T4, T5, T6, or T7 includes a semiconductor layer including oxide, and the others include a semiconductor layer including amorphous silicon or polysilicon.

In detail, a first driving transistor directly affecting the brightness of the display apparatus 1 includes a semiconductor layer including polycrystal silicon having a high reliability, and thus a high-resolution display apparatus may be realized.

Because an oxide semiconductor has a high carrier mobility and a low leakage current, a voltage drop may not be big even when a driving time is long. In other words, because a change in the color of an image according to a voltage drop is not big even during low frequency driving, low frequency driving may be performed.

Because an oxide semiconductor has a small leakage current as described above, at least one of the compensating transistor T3 or the first initializing transistor T4 connected to the gate electrode of the driving transistor T1 includes an oxide semiconductor in order to prevent flowing of a leakage current to the gate electrode of the first transistor T1 and also reduce power consumption.

The subpixel circuit PC is not limited to the number of thin-film transistors, the number of capacitors, and the circuit designs described above with reference to FIGS. 5 and 6. The number of thin-film transistors, the number of capacitors, other electrical components, and a circuit design may vary. For example, some embodiments may include additional components or fewer components without departing from the spirit and scope of embodiments according to the present disclosure.

FIG. 7 is a schematic cross-sectional view of a display panel according to some embodiments. In more detail, FIG. 7 corresponds to a cross-section taken along the line II-II' of FIG. 3.

Referring to FIG. 7, the display panel 10 may include the substrate 100, an inorganic insulating layer IIL, an organic insulating layer OIL, a subpixel circuit PC, a connection electrode CM, an organic light-emitting diode OLED, a pixel defining layer 118, a spacer 119, and an encapsulation layer 300. In other words, the substrate 100, the inorganic insulating layer IIL, the organic insulating layer OIL, the subpixel circuit PC, the connection electrode CM, the organic light-emitting diode OLED, the pixel defining layer 118, the spacer 119, and the encapsulation layer 300 may be arranged on the display area DA of the display panel 10.

The substrate 100 may include a first base layer 100*a*, a first barrier layer 100*b*, a second base layer 100*c*, and a second barrier layer 100*d*. According to some embodiments, the first base layer 100*a*, the first barrier layer 100*b*, the second base layer 100*c*, and the second barrier layer 100*d* may be sequentially stacked on one another in a thickness direction of the substrate 100.

At least one of the first base layer 100*a* or the second base layer 100*c* may include polymer resin such as polyethersulfone, polyacrylate, polyetherimide, polyethylene naphthalate, polyethylene terephthalate, polyphenylene sulfide, polyimide, polycarbonate, cellulose triacetate, or cellulose acetate propionate.

Each of the first barrier layer 100*b* and the second barrier layer 100*d*, which is a barrier layer for preventing penetration of an external foreign material, may have a single or multi-layer structure including an inorganic material such as silicon nitride ($SiN_X$), silicon oxide ($SiO_2$), and/or silicon oxynitride (SiON).

A buffer layer 111 may be arranged on the substrate 100. The buffer layer 111 may include an inorganic insulating material, such as silicon nitride ($SiN_X$), silicon oxynitride (SiON), or silicon oxide ($SiO_2$), and may have a single-layer or multi-layer structure including the aforementioned inorganic insulating material.

The inorganic insulating layer IIL may be arranged on the buffer layer 111. The inorganic insulating layer IIL may include a first inorganic insulating layer 112, a second inorganic insulating layer 113, and a third inorganic insulating layer 114. A subpixel circuit PC may be arranged in the display area DA. The subpixel circuit PC may include a thin-film transistor TFT and a storage capacitor Cst. The thin-film transistor TFT may include a semiconductor layer Act, a gate electrode GE, a source electrode SE, and a drain electrode DE.

The semiconductor layer Act may be arranged on the buffer layer 111. The semiconductor layer Act may include polysilicon. Alternatively, the semiconductor layer Act may include, for example, amorphous silicon, an oxide semiconductor, or an organic semiconductor. The semiconductor layer Act may include a channel region, and a source region and a drain region respectively arranged on both sides of the channel region.

The gate electrode GE may be arranged on the semiconductor layer Act. The gate electrode GE may overlap the channel region. The gate electrode GE may include a low resistance metal material. The gate electrode GE may include a conductive material including molybdenum (Mo), aluminum (Al), copper (Cu), and titanium (Ti), and may be formed as a multi-layer or single layer including the aforementioned materials.

The first inorganic insulating layer 112 may be between the semiconductor layer Act and the gate electrode GE. The first inorganic insulating layer 112 may include an inorganic insulating material, such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

The second inorganic insulating layer 113 may be arranged on the gate electrode G. The second inorganic insulating layer 113 may be included to cover the gate electrode GE. The second inorganic insulating layer 113 may include an inorganic insulating material, such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

The upper electrode CE2 of the storage capacitor Cst may be on the second inorganic insulating layer 113. The upper electrode CE2 may overlap the gate electrode GE located therebelow. In this case, the gate electrode GE and the upper electrode CE2 overlapping each other with the second inorganic insulating layer 113 therebetween may constitute the storage capacitor Cst. In other words, the gate electrode GE may function as the lower electrode CE1 of the storage capacitor Cst.

Thus, the storage capacitor Cst and the thin-film transistor TFT may overlap each other. However, the disclosure is not limited thereto. For example, the storage capacitor Cst and the thin-film transistor TFT may not overlap each other. In other words, the lower electrode CE1 of the storage capacitor Cst, which is a separate component from the gate electrode GE of the thin-film transistor TFT, may be included apart from the gate electrode GE of the thin-film transistor TFT.

The upper electrode CE2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu), and may be a single layer or multi-layer including the aforementioned materials.

The third inorganic insulating layer 114 may be arranged on the upper electrode CE2. The third inorganic insulating layer 114 may cover the upper electrode CE2. The third inorganic insulating layer 114 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide (ZnO), or the like. The third inorganic insulating layer 114 may be a single layer or multi-layer including the aforementioned inorganic insulating material.

The drain electrode DE and the source electrode SE may be located on the third inorganic insulating layer 114. The drain electrode DE and the source electrode SE may each be connected to the semiconductor layer Act via respective contact holes included in the first inorganic insulating layer 112, the second inorganic insulating layer 113, and the third inorganic insulating layer 114. The drain electrodes DE and the source electrode SE may include a highly conductive material. Each of the source electrode SE and the drain electrode DE may include a conductive material including Mo, Al, Cu, and Ti, and may be a multi-layer or single layer including the aforementioned materials. For example, the drain electrodes DE and the source electrode SE may have a multi-layer structure of Ti/Al/Ti.

The organic insulating layer OIL may be located on the inorganic insulating layer IIL. The organic insulating layer OIL may include a first organic insulating layer 115 and a second organic insulating layer 116. Although two organic insulating layers OIL are provided in FIG. 6, the disclosure is not limited thereto. Three or four organic insulating layers OIL may be included.

The first organic insulating layer 115 may cover the drain electrode DE and the source electrode SE. The first organic insulating layer 115 may include an organic insulating material, such as a commercial polymer (such as PMMA or PS), a polymer derivative having a phenol-based group, an acrylic polymer, an imide-based polymer, an acryl ether-based polymer, an amide-based polymer, a fluorine-based polymer, a p-xylene-based polymer, a vinyl alcohol-based polymer, or a blend thereof.

The connection electrode CM may be on the first organic insulating layer 115. In this case, the connection electrode CM may be connected to the drain electrode DE or the source electrode SE through the contact hole of the first organic insulating layer 115. The connection electrode CM may include a highly conductive material. The connection electrode CM may include a conductive material including Mo, Al, Cu, and Ti, and may be formed as a multi-layer or single layer including the aforementioned materials. For example, the connection electrode CM may have a multi-layer structure of Ti/Al/Ti.

The second organic insulating layer 116 may be arranged on the connection electrode CM. The second organic insulating layer 116 may cover the connection electrode CM. The second organic insulating layer 116 may include the same material as that included in the first organic insulating layer 115, or may include a different material from that included in the first organic insulating layer 115.

A light-emitting diode may be located on the second organic insulating layer 116. For example, the organic light-emitting device OLED may be arranged on the second organic insulating layer 116. According to some embodiments, an inorganic light-emitting diode or the like may be located on the second organic insulating layer 116.

The organic light-emitting diode OLED may emit red light, green light, or blue light, or may emit red light, green light, blue light, or white light. The organic light-emitting diode OLED may include a subpixel electrode 211, an emission layer 212*b*, a functional layer 212*f*, an opposite electrode 213, and a capping layer 215.

The subpixel electrode 211 may be located on the second organic insulating layer 116. The subpixel electrode 211 may be electrically connected to the connection electrode CM through a contact hole defined in the second organic insulating layer 116. The subpixel electrode 211 may include conductive oxide such as indium tin oxide (ITO), indium zinc oxide (IZO), zinc oxide (ZnO), indium oxide ($In_2O_3$), indium gallium oxide (IGO), or aluminum zinc oxide (AZO). According to some embodiments, the subpixel electrode 211 may include a reflective layer including silver (Ag), magnesium (Mg), aluminum (Al), platinum (Pt), palladium (Pd), gold (Au), nickel (Ni), neodymium (Nd), iridium (Ir), chromium (Cr), or a compound of these materials. According to some embodiments, the subpixel electrode 211 may further include a film formed of ITO, IZO, ZnO, or $In_2O_3$ above/below the reflective layer. For example, the subpixel electrode 211 may have a multi-layered structure of ITO/Ag/ITO.

A pixel defining layer 118 having an opening through which at least a portion of the subpixel electrode 211 is exposed may be arranged on the subpixel electrode 211. An emission area of light emitted by the organic light-emitting device OLED may be defined through the opening defined in the pixel defining layer 118. For example, a width of the opening may correspond to a width of the emission area.

The pixel defining layer 118 may include an organic insulating material. Alternatively, the pixel defining layer 118 may include an inorganic insulating material such as silicon nitride, silicon oxynitride, or silicon oxide. Alternatively, the pixel defining layer 118 may include an organic insulating material and an inorganic insulating material. According to some embodiments, the pixel defining layer 118 may include a light shielding material. The light shielding material may include carbon black, carbon nanotubes, resin or paste including a black pigment, metal particles (e.g., nickel, aluminum, molybdenum, and an alloy thereof), metal oxide particles (e.g., a chromium oxide), or metal nitride particles (e.g., a chromium nitride). When the pixel defining layer 118 includes the light shielding material, external light reflection due to metal structures arranged under the pixel defining layer 118 may be reduced.

A spacer 119 may be located on the pixel defining layer 118. The spacer 119 may include an organic insulating material such as polyimide. Alternatively, the spacer 119 may include an inorganic insulating material such as silicon nitride (SiNx) or silicon oxide ($SiO_2$), or may include an inorganic insulating material and an organic insulating material.

According to some embodiments, the spacer 119 may include the same material as that included in the pixel defining layer 118. The pixel defining layer 118 and the spacer 119 may be simultaneously (or concurrently) formed during a mask process that uses a half-tone mask. Alternatively, the spacer 119 may include a material different from that included in the pixel defining layer 118.

The emission layer 212*b* may be located in the opening of the pixel defining layer 118. The emission layer 212*b* may include a low molecular weight or high molecular weight organic material that emits light of a certain color.

The functional layer 212*f* may include a first functional layer 212*a* and a second functional layer 212*c*. The first functional layer 212*a* may be located between the subpixel electrode 211 and the emission layer 212*b*, and the second functional layer 212*c* may be located between the emission layer 212*b* and the opposite electrode 213. However, at least one of the first functional layer 212*a* or the second functional layer 212*c* may be omitted. A case where the first functional layer 212*a* and the second functional layer 212*c* are individually arranged will now be focused on and described in detail.

The first functional layer 212*a* may include a hole transport layer (HTL) and/or a hole injection layer (HIL). The second functional layer 212*c* may include an electron transport layer (ETL) and/or an electron injection layer (EIL). The first functional layer 212*a* and/or the second functional layer 212*c* may be a common layer formed to entirely cover the substrate 100, similar to an opposite electrode 213 to be described later.

The opposite electrode 213 may be arranged on the functional layer 212*f*. The opposite electrode 213 may include a conductive material having a low work function. For example, the opposite electrode 213 may include a (semi)transparent layer including, for example, silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca) or an alloy of these materials. Alternatively, the opposite electrode 213 may further include a layer, such as ITO, IZO, ZnO, or $In_2O_3$, on the (semi)transparent layer including any of the above-described materials.

According to some embodiments, the capping layer 215 may be located on the opposite electrode 213. The capping layer 215 may include lithium fluoride (LiF), an inorganic material, or/and an organic material.

The encapsulation layer 300 may be arranged on the organic light-emitting diode OLED. The encapsulation layer 300 may cover the organic light-emitting diode OLED. The encapsulation layer 300 may be located on the opposite electrode 213 and/or the capping layer 215. According to some embodiments, the encapsulation layer 300 may include at least one inorganic layer and at least one organic layer. In FIG. 6, the encapsulation layer 300 includes the first inorganic encapsulation layer 310, the organic encapsulation layer 320, and the second inorganic encapsulation layer 330 sequentially stacked on one another.

The first and second inorganic encapsulation layers 310 and 330 may include at least one inorganic material, such as aluminum oxide, titanium oxide, tantalum oxide, hafnium oxide, zinc oxide, silicon oxide, silicon nitride, and silicon oxynitride. The first and second inorganic encapsulation layers 310 and 330 may be a single layer or multi-layer including the aforementioned materials. The organic encapsulation layer 320 may include a polymer-based material. Examples of the polymer-based material may include an acrylic resin, an epoxy-based resin, polyimide, and polyethylene. According to some embodiments, the organic encapsulation layer 320 may include acrylate.

An input sensing layer 48 may be arranged on the encapsulation layer 300. The input sensing layer 48 may include a first touch insulating layer 410, a second touch insulating layer 420, a first conductive layer 430, a third touch insulating layer 440, a second conductive layer 450, and a planarization layer 460.

According to some embodiments, the first touch insulating layer 410 may be arranged on the second inorganic insulating layer 330, and the second touch insulating layer 420 may be arranged on the first touch insulating layer 410. According to some embodiments, each of the first and second touch insulating layers 410 and 420 may include an inorganic insulating material and/or an organic insulating material. For example, each of the first and second touch insulating layers 410 and 420 may include an inorganic insulating material, such as silicon oxide, silicon nitride, and/or silicon oxynitride.

According to some embodiments, at least one of the first or second touch insulating layers 410 or 420 may be omitted. For example, the first touch insulating layer 410 may be omitted. In this case, the second touch insulating layer 420 may be arranged on the second inorganic insulating layer 330, and the first conductive layer 430 may be arranged on the second touch insulating layer 420.

The first conductive layer 430 may be arranged on the second touch insulating layer 420, and the third touch insulating layer 440 may be arranged on the first conductive layer 430. According to some embodiments, the third touch insulating layer 440 may include an inorganic insulating material and/or an organic insulating material. For example, the third touch insulating layer 440 may include an inorganic insulating material, such as silicon oxide, silicon nitride, and/or silicon oxynitride.

The second conductive layer 450 may be arranged on the third touch insulating layer 440. A touch electrode TE of the input sensing layer 48 may have a structure in which the first conductive layer 430 and the second conductive layer 450 are connected to each other. Alternatively, the touch electrode TE may be formed on one of the first conductive layer 430 and the second conductive layer 450, and may include a metal line in the one of the first conductive layer 430 and the second conductive layer 450. The first conductive layer 430 and the second conductive layer 450 may each include at least one of aluminum (Al), copper (Cu), titanium (Ti), molybdenum (Mo), or indium tin oxide (ITO), and may be implemented as a single layer or multiple layers including the aforementioned materials. For example, the first conductive layer 430 and the second conductive layer 450 may each have a three-layered structure of Ti layer/AI layer/Ti layer.

According to some embodiments, the planarization layer 460 may cover the second conductive layer 450. The planarization layer 460 may include an organic insulating material.

Figure 8:
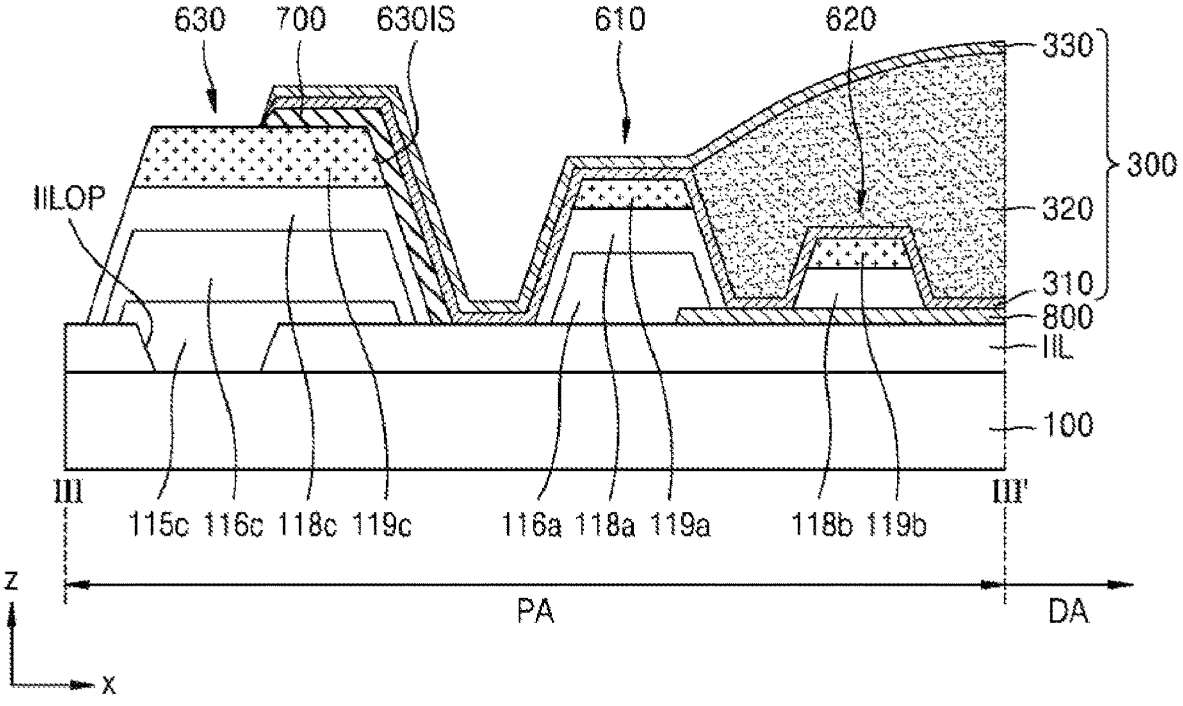
FIGS. 8 and 9 are schematic cross-sectional views of a peripheral area of a display panel according to some embodiments.
Figure 9:
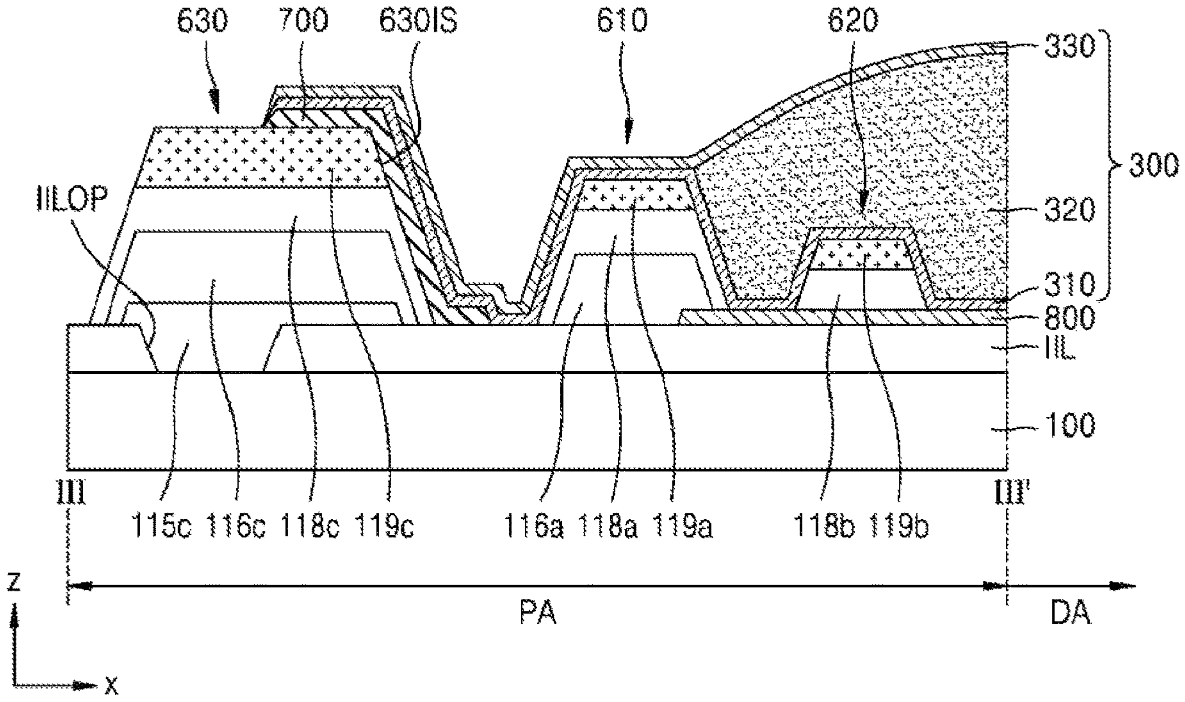

FIGS. 8 and 9 are schematic cross-sectional views of the peripheral area PA of the display panel 10 according to some embodiments. In more detail, FIGS. 8 and 9 are cross-sectional views of the display panel 10 taken along the line III-III' of FIG. 3.

Referring to FIGS. 8 and 9, the substrate 100 may be located on the peripheral area PA of the display panel 10. The inorganic insulating layer IIL may be arranged on the substrate 100. According to some embodiments, the inorganic insulating layer IIL may include the first inorganic insulating layer 112, the second inorganic insulating layer 113, and the third inorganic insulating layer 114. However, the disclosure is not limited thereto.

An electrode 800 supplying the common voltage ELVSS may be located on at least a portion of the inorganic insulating layer IIL located on the peripheral area PA of the display panel 10. In detail, the electrode 800 supplying the common voltage ELVSS may be located on at least a portion adjacent to the display area DA among the inorganic insulating layer IIL located on the peripheral area PA. However, the disclosure is not limited thereto.

According to some embodiments, a first dam 610, a second dam 620, and a bank 630 may be located on the peripheral area PA of the display panel 10. The first organic insulating layer 115, the second organic insulating layer 116, the pixel defining layer 118, and the spacer 119 may be arranged on the inorganic insulating layer IIL. The first organic insulating layer 115, the second organic insulating layer 116, the pixel defining layer 118, or the spacer 119 arranged the peripheral area PA of the display panel 10 may be patterned such that the first dam 610, the second dam 620, and the bank 630 may be formed. As described above, the first and second dams 610 and 620 may prevent a material for forming the organic encapsulation layer 320 from being diffused toward the edge of the substrate 100, and may limit a formation location of the organic encapsulation layer 320. The bank 630 may be located in a lower portion of the display panel 10, and may serve to support a mask by coming into contact with the mask in a process of forming the display panel 10.

A height between an upper surface of the inorganic insulating layer IIL and an upper surface of the bank 630 may be greater than a height between the upper surface of the inorganic insulating layer IIL and an upper surface of the first dam 610. The height between the upper surface of the inorganic insulating layer IIL and the upper surface of the bank 630 may be greater than a height between the upper surface of the inorganic insulating layer IIL and an upper surface of the second dam 620. By rendering the height between the upper surface of the inorganic insulating layer IIL and the upper surface of the bank 630 greater than a height between the upper surface of the inorganic insulating layer IIL and the upper surface of the first dam 610 and/or the second dam 620, the bank 630 may support the mask by coming into contact with the mask in the process of forming the display panel 10. The height between the upper surface of the inorganic insulating layer IIL and the upper surface of the first dam 610 may be greater than the height between the upper surface of the inorganic insulating layer IIL and the upper surface of the second dam 620. However, the disclosure is not limited thereto.

According to some embodiments, the first dam 610 may be between the bank 630 and the display area DA. The second dam 620 may be located between the first dam 610 and the display area DA. The first dam 610 may be located between the bank 630 and the second dam 620. The second dam 620 may be located most adjacent to the display area DA of the display panel 10. The bank 630 may be located most apart (e.g., furthest away) from the display area DA of the display panel 10. In other words, the bank 630, the first dam 610, and the second dam 620 may be sequentially arranged in a direction toward the display area DA in the peripheral area PA. However, the disclosure is not limited thereto.

The first dam 610 may include a portion 116*a* of the second organic insulating layer 116, a portion 118*a* of the pixel defining layer 118, and a portion 119*a* of the spacer 119. In other words, the second organic insulating layer 116, the pixel defining layer 118, and the spacer 119 may be patterned such that the first dam 610 may be formed. The second dam 620 may include a portion 118*b* of the pixel defining layer 118 and a portion 119*b* of the spacer 119. In other words, the pixel defining layer 118 and the spacer 119 may be patterned such that the second dam 620 may be formed. The bank 630 may include a portion 115*c* of the first organic insulating layer 115, a portion 116*c* of the second organic insulating layer 116, a portion 118*c* of the pixel defining layer 118, and a portion 119*c* of the spacer 119. In other words, the first organic insulating layer 115, the second organic insulating layer 116, the pixel defining layer 118, and the spacer 119 may be patterned such that the bank 630 may be formed. According to some embodiments, an opening IILOP may be formed in the inorganic insulating layer IIL located below the bank 630. The opening IILOP of the inorganic insulating layer IIL located below the bank 630 may be filled with the portion 115*c* of the first organic insulating layer 115. However, the disclosure is not limited thereto.

According to some embodiments, the first inorganic encapsulation layer 310 and the second inorganic encapsulation layer 330 may be located on the first dam 610, the second dam 620, and the bank 630 arranged on the peripheral area PA of the display panel 10. The first inorganic encapsulation layer 310 and the second inorganic encapsulation layer 330 may also be located on a portion of the electrode 800 exposed between the first dam 610 and the second dam 620, the electrode 800 supplying the common voltage ELVSS, and a portion of the inorganic insulating layer IIL exposed between the bank 630 and the second dam 620. As described above, the first inorganic encapsulation layer 310 and the second inorganic encapsulation layer 330 may also be located on the display area DA of the display panel 10. In other words, the first inorganic encapsulation layer 310 and the second inorganic encapsulation layer 330 located on the display area DA of the display panel 10 may extend to the peripheral area PA. Each of the first and second inorganic encapsulation layer 310 and 330 may be discontinuous on the upper surface of the bank 630. Respective ends of the first and second inorganic encapsulation layer 310 and 330 that are discontinuous on the upper surface of the bank 630 may meet each other. In other words, respective lengths of the first and second inorganic encapsulation layer 310 and 330 located on the upper surface of the bank 630 may be the same as each other. However, the disclosure is not limited thereto.

The encapsulation layer 300 may include the first inorganic encapsulation layer 310, the second inorganic encapsulation layer 330, and the organic encapsulation layer 320. The organic encapsulation layer 320 may be located between the first inorganic encapsulation layer 310 and the second inorganic encapsulation layer 330. The organic encapsulation layer 320 may also extend from the display area DA to the peripheral area PA, like the first inorganic encapsulation layer 310 and the second inorganic encapsulation layer 330. However, the organic encapsulation layer 320 may be interrupted by the second dam 620. Because the organic encapsulation layer 320 is interrupted by the second dam 620, the first inorganic encapsulation layer 310 and the second inorganic encapsulation layer 330 may be arranged in direct contact with each other in a range from the upper surface of the second dam 620 to the upper surface of the bank 630. In other words, the second inorganic encapsulation layer 330 may be arranged in direct contact with the upper surface of the first inorganic encapsulation layer 310 in a range from the upper surface of the second dam 620 to the upper surface of the bank 630. However, the disclosure is not limited thereto. The organic encapsulation layer 320 may be interrupted by the first dam 610.

After the display panel 10 is formed, when reliability of the display panel 10 progresses at high temperature and high humidity, electrodes included in the display panel 10 or at least some of the layers included in the display panel 10 may be oxidized. When moisture permeates the bank 630 of the display panel 10, the portions 115*c* and 116*c* of the first and second organic encapsulation layers 115 and 116 constituting an end of the bank 630 may expand. When moisture permeates the bank 630 of the display panel 10, the first inorganic encapsulation layer 310 located on the end of the bank 630 may be oxidized. The oxidation of the first inorganic encapsulation layer 310 may reduce adhesion between the first inorganic encapsulation layer 310 and the inorganic insulating layer IIL in a direction from the end of the bank 630 to the display area DA. When the adhesion between the first inorganic encapsulation layer 310 and the inorganic insulating layer IIL decreases, the first inorganic encapsulation layer 310 and the inorganic insulating layer IIL may be separated from each other, and the inorganic insulating layer IIL may be finely damaged. The moisture permeation may be accelerated due to the damage to the inorganic insulating layer IIL, and thus even the electrodes located on the inorganic insulating layer IIL may be oxidized. According to some embodiments, electrodes may also be located on the inorganic insulating layer IIL in the peripheral area PA of the display panel 10. In order to prevent oxidation of the first inorganic encapsulation layer 310, which causes oxidation of the electrodes included in the display panel 10, a structure capable of blocking the first inorganic encapsulation layer 310 from moisture may be needed.

According to some embodiments, a metal layer 700 may be formed on the bank 630. In other words, in order to block the first inorganic encapsulation layer 310 located on the bank 630 from moisture, the metal layer 700 directly contacting the lower surface of the first inorganic encapsulation layer 310 may be located. For example, the metal layer 700 may be located on at least a portion of the upper surface of the bank 630 and a lateral surface 630IS adjacent to the display area DA among the lateral surfaces of the bank 630.

In other words, a length of the metal layer 700 located on the upper surface of the bank 630 may be the same as each of the respective lengths of the first and second inorganic encapsulation layer 310 and 330 located on the upper surface of the bank 630. However, embodiments according to the present disclosure are not limited thereto, and the length of the metal layer 700 located on the upper surface of the bank 630 may be greater than each of the respective lengths of the first and second inorganic encapsulation layer 310 and 330 located on the upper surface of the bank 630.

According to some embodiments, the metal layer 700 may also be located on the inorganic insulating layer IIL exposed between the bank 630 and the first dam 610, as well as on the at least a portion of the upper surface of the bank 630 and the lateral surface 630IS adjacent to the display area DA among the lateral surfaces of the bank 630. However, embodiments according to the present disclosure are not limited thereto. The metal layer 700 may be located not only on the inorganic insulating layer IIL exposed between the bank 630 and the first dam 610 but also on the second dam 620. In other words, the metal layer 700 may be arranged to further extend in a direction toward the display area DA.

According to some embodiments, the metal layer 700 may include conductive oxide. In detail, the metal layer 700 may include indium gallium zinc oxide (IGZO) or indium tin oxide (ITO). The metal layer 700 may also include a compound of oxygen (O) and at least one of aluminum (Al), titanium (Ti), or tungsten (W). For example, the metal layer 700 may include one of aluminum oxide ($AlO_X$), titanium oxide ($TiO_X$), and tungsten oxide ($WO_X$). However, the disclosure is not limited thereto.

According to some embodiments, the metal layer 700 may have a thickness of about 10 Å or more and about 1000 Å or less. For example, the metal layer 700 may have a thickness of about 500 Å. When the thickness of the metal layer 700 exceeds about 1,000 Å, a process of etching the metal layer 700 may take a relatively large amount of time, and the manufacturing costs of a display apparatus may increase. When the thickness of the metal layer 700 is less than about 10 Å, oxidation of the first inorganic encapsulation layer 310 may not be prevented. However, the disclosure is not limited thereto.

FIGS. 10 through 19 are cross-sectional views schematically illustrating a method of manufacturing the display panel 10, according to some embodiments. In more detail, FIGS. 10 through 19 schematically illustrate cross-sectional views of the display panel 10 of FIG. 4 taken along the line III-III' and cross-sectional views of the display panel 10 of FIG. 3 taken along the line IV-IV'.

The two drawings (e.g., FIGS. 10A and 10B) included in each of FIGS. 10 through 19 are schematic cross-sectional views corresponding to the same process.

Referring to FIGS. 10 through 19, the method of manufacturing the display panel 10 may include the operations of preparing for the substrate 100 including the display area DA, the opening area OA, the middle area MA, and the peripheral area PA outside the display area DA, arranging the inorganic insulating layer IIL on the substrate 100, forming the bank 630 on the inorganic insulating layer IIL, consecutively covering the substrate 100 with a metal layer forming material 701, and forming the metal layer 700 on at least a portion of the upper surface of the bank 630 and the lateral surface 630IS adjacent to the display area DA among the lateral surfaces of the bank 630 by patterning the metal layer forming material 701.

Figure 10A:
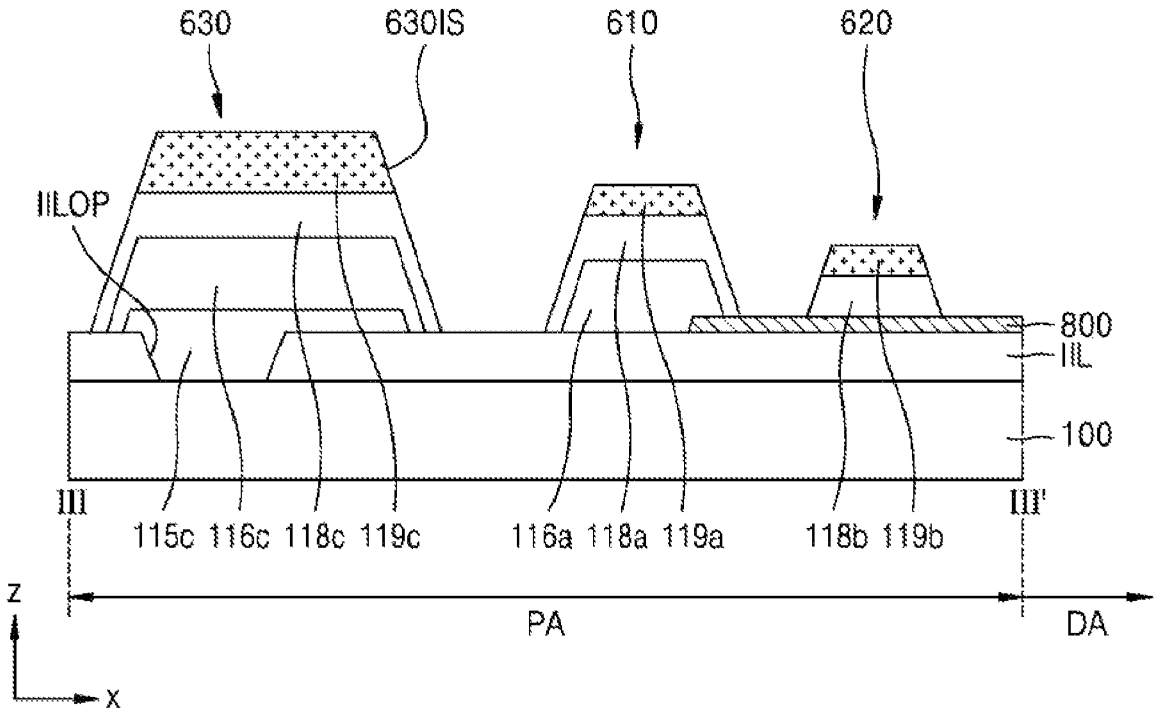
FIGS. 10A, 10B, 11A, 11B, 12A, 12B, 13A, 13B, 14A, 14B, 15A, 15B, 16A, 16B, 17A, 17B, 18A, 18B, 19A, and 19B are cross-sectional views schematically illustrating a method of manufacturing a display panel, according to some embodiments.
Figure 10B:
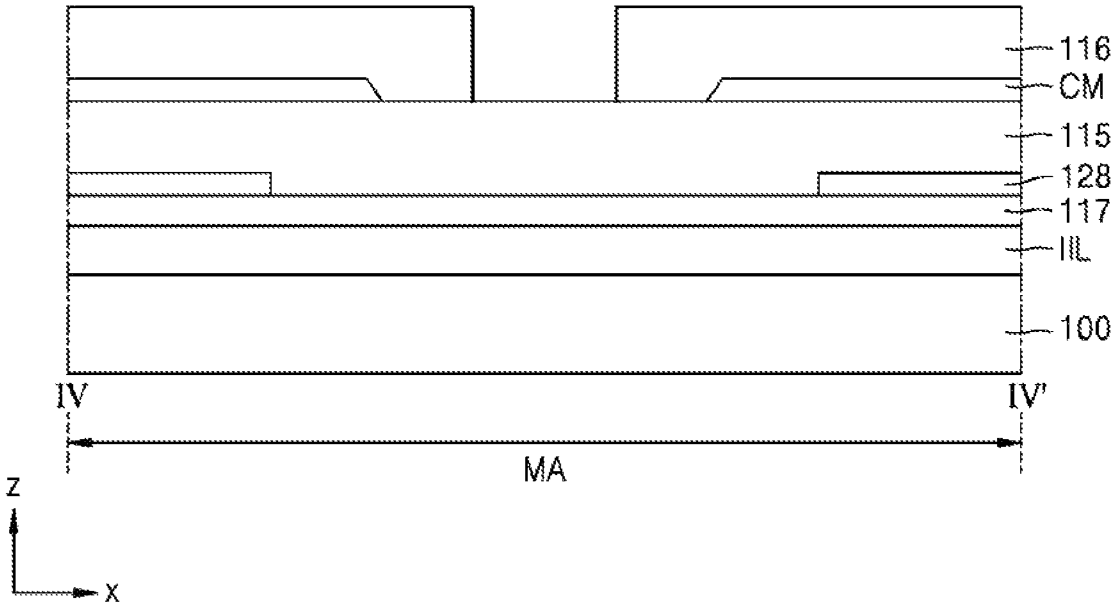
Figure 11A:
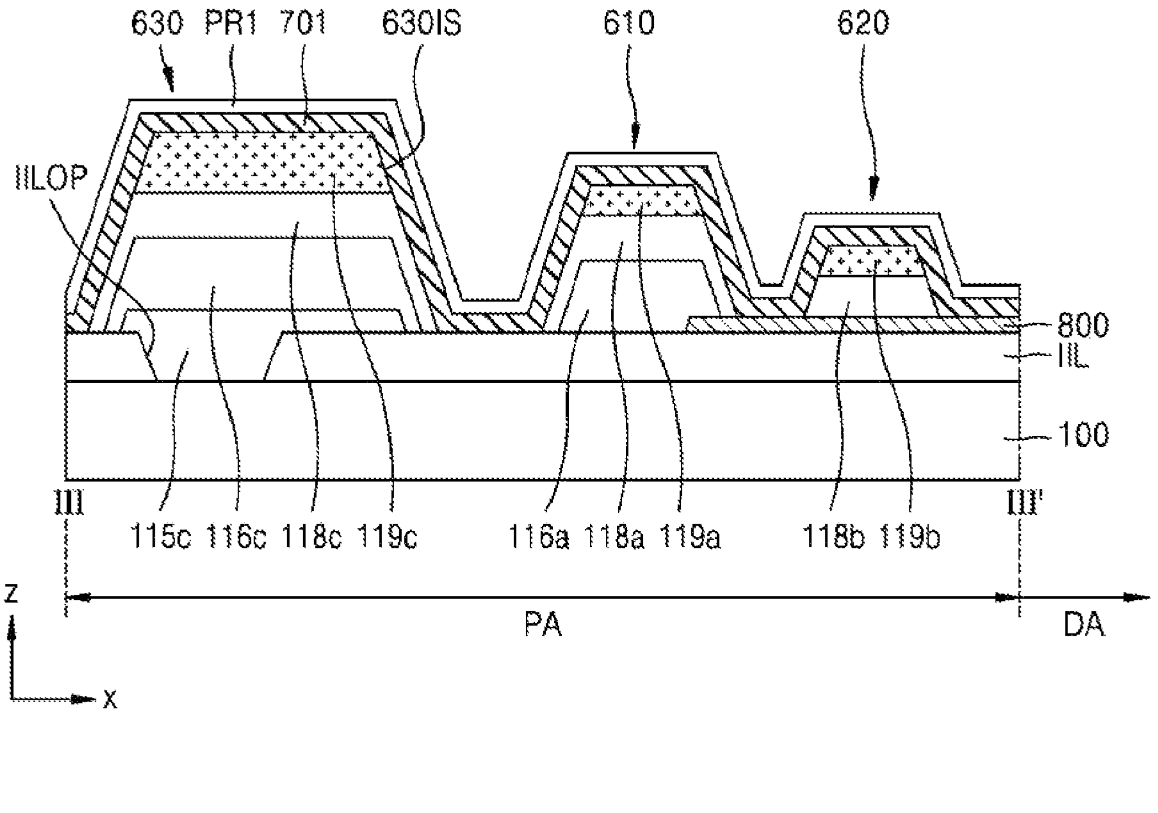
Figure 11B:
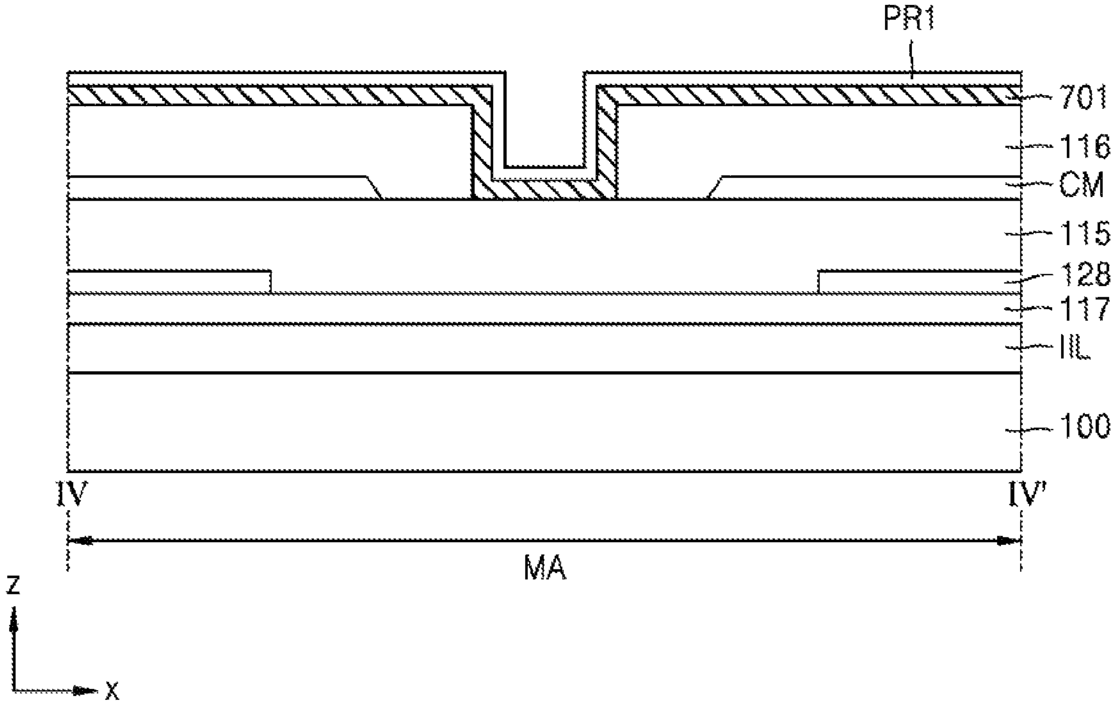
Figure 12A:
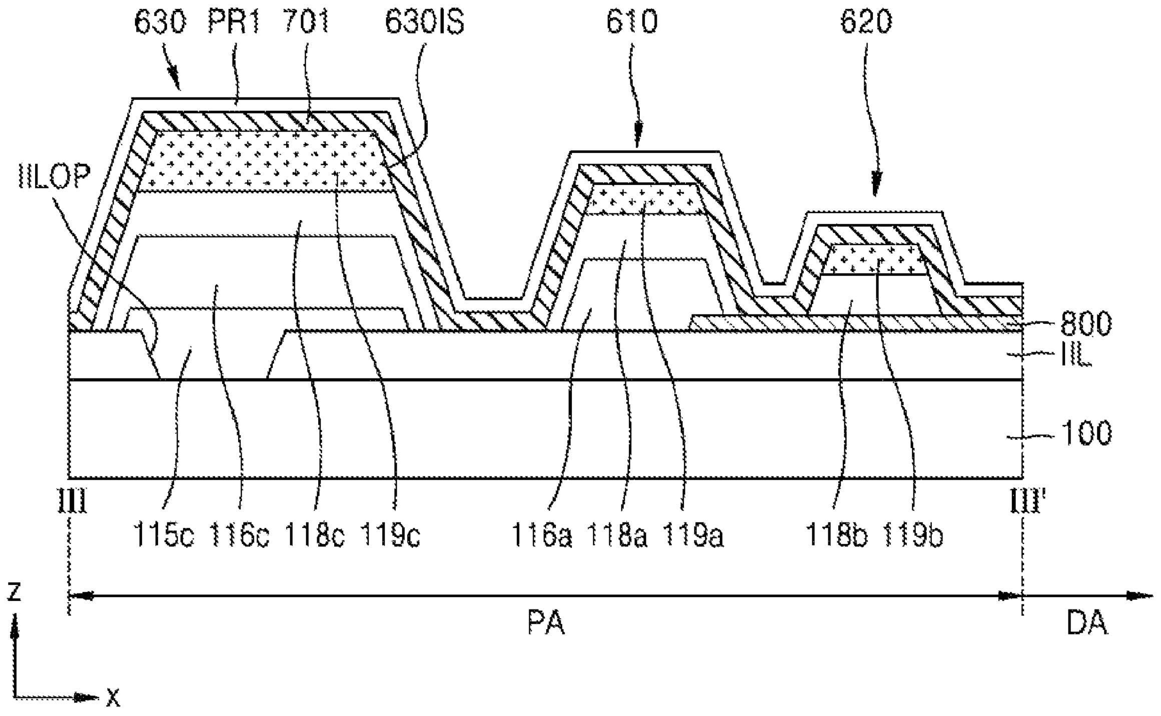
Figure 12B:
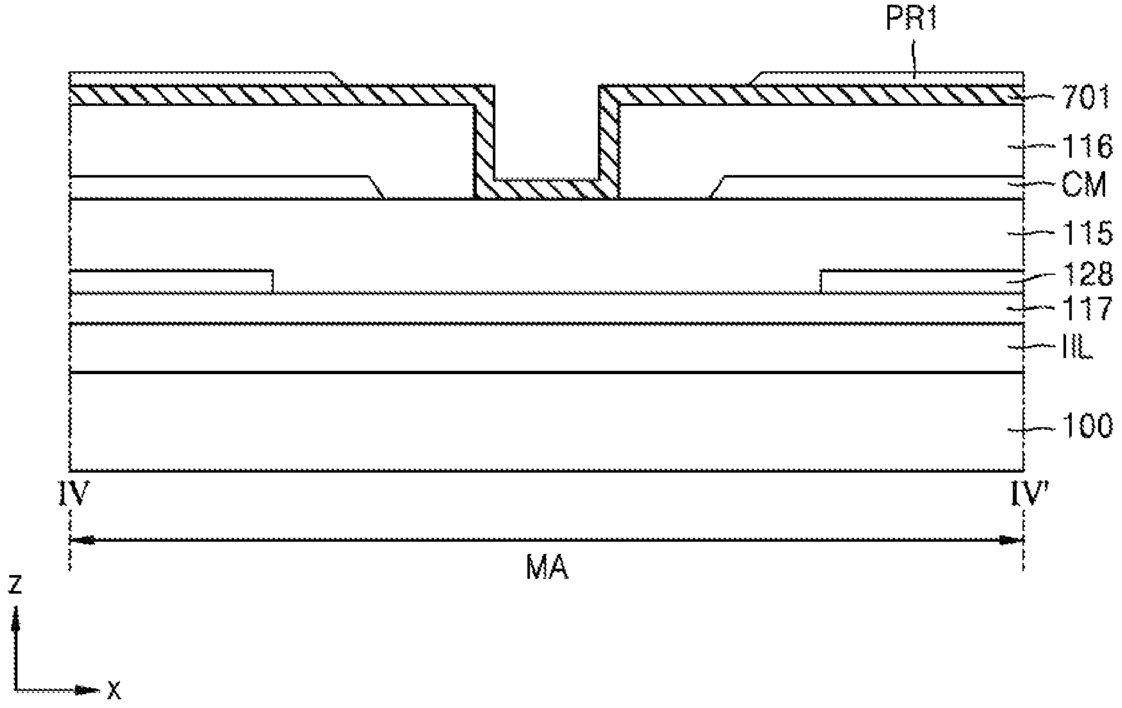
Figure 13A:
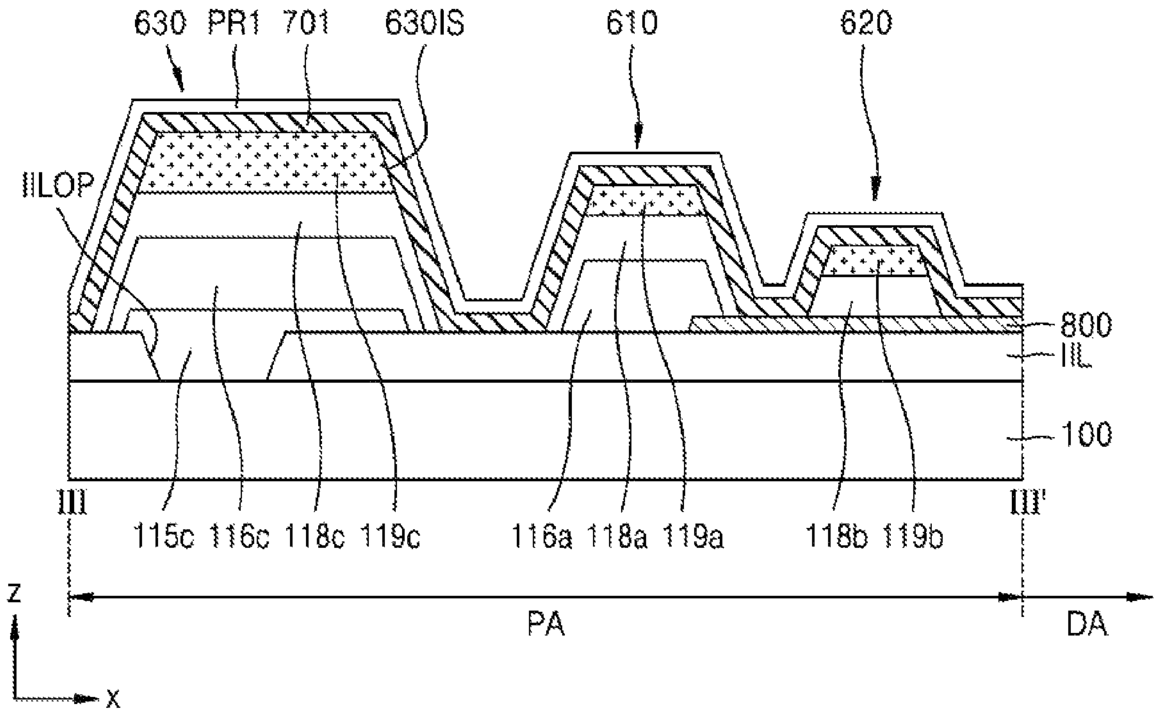
Figure 13B:
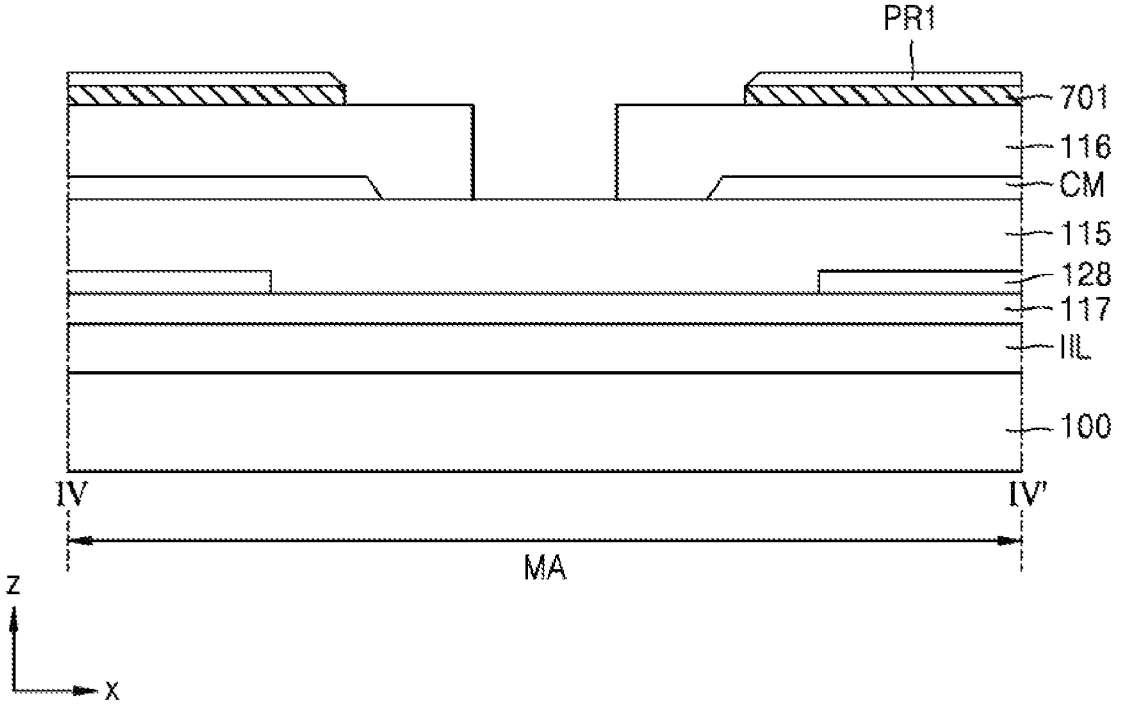
Figure 14A:
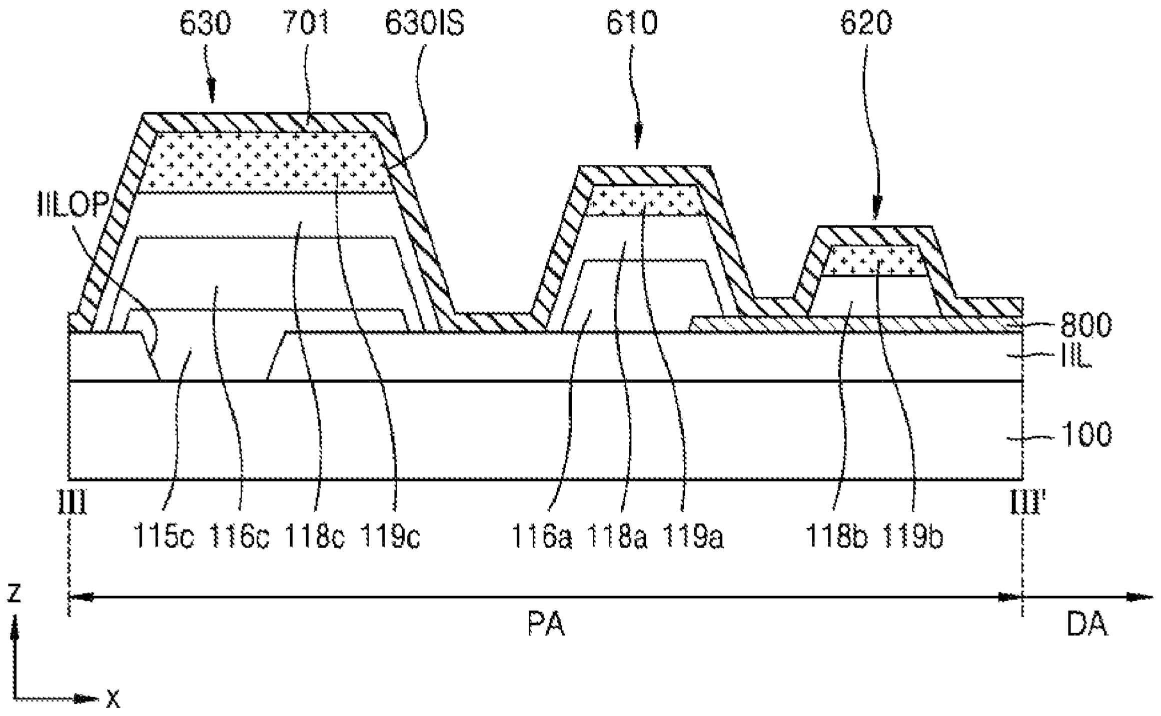
Figure 14B:
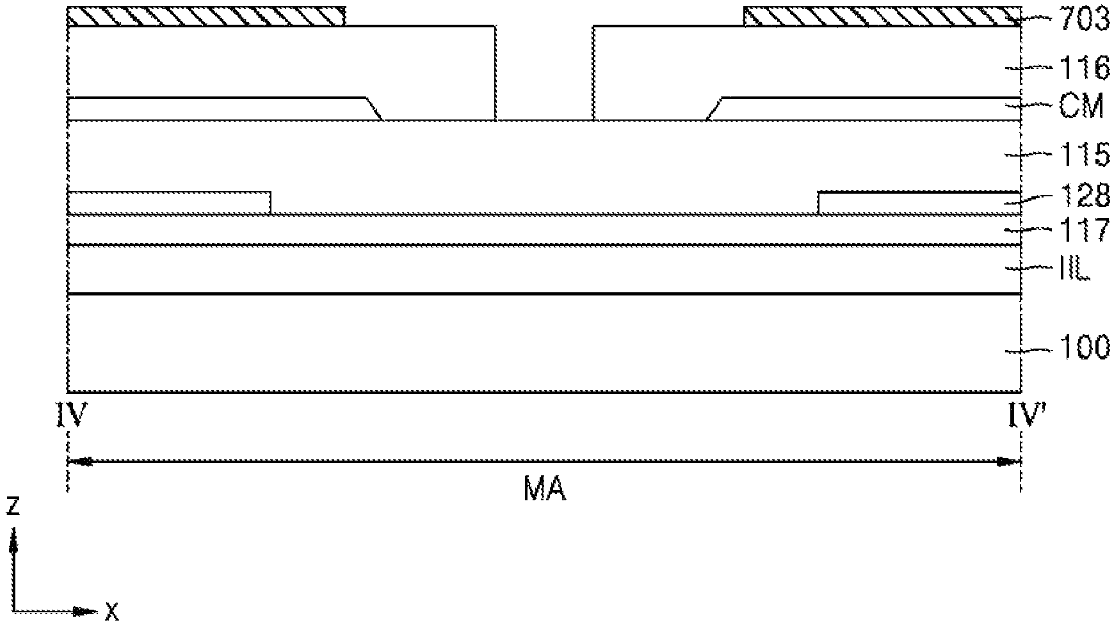

Referring to FIGS. 10A and 10B, the inorganic insulating layer IIL may be located on the substrate 100 in the peripheral area PA, the opening area OA, and the middle area MA of the display panel 10. According to some embodiments, the inorganic insulating layer IIL may also be located on the substrate 100 in the display area DA. The inorganic insulating layer IIL may include the first inorganic insulating layer 112, the second inorganic insulating layer 113, and the third inorganic insulating layer 114. The first organic insulating layer 115, the second organic insulating layer 116, the pixel defining layer 118, and the spacer 119 may be arranged on the inorganic insulating layer IIL in the peripheral area PA of the display panel 10. The first organic insulating layer 115, the second organic insulating layer 116, the pixel defining layer 118, or the spacer 119 may be patterned such that the first dam 610, the second dam 620, and the bank 630 may be formed. In other words, the first dam 610 may include the portion 116*a* of the organic insulating layer 116, the portion 118*a* of the pixel defining layer 118, and the portion 119*a* of the spacer 119, and the second dam 620 may include the portion 118*ba* of the second pixel defining layer 118 and the portion 119*b* of the spacer 119. The bank 630 may include the portion 115*c* of the first organic insulating layer 115, the portion 116*c* of the second organic insulating layer 116, the portion 118*c* of the pixel defining layer 118, and the portion 119*c* of the spacer 119. According to some embodiments, the portion 115*c* of the first organic insulating layer 115, which forms the bank 630, may be filled in the opening IILOP defined in the inorganic insulating layer K.

According to some embodiments, a protective layer 117 may be formed on the inorganic insulating layer IIL in the middle area MA of the display panel 10. The protective layer 117 may include, for example, amorphous silicon, an oxide semiconductor, or an organic semiconductor. The protective layer 117 located in the middle area MA of the display panel 10 may serve as an etch stopper, when a groove G is formed by etching the first organic insulating layer 115 and the second organic insulating layer 116 arranged in the middle area MA. The protective layer 117 may prevent or reduce instances of the inorganic insulating layer IIL and the substrate 100 located therebelow being etched.

According to some embodiments, fourth insulating layers 128 may be located on the protective layer 117. The fourth insulating layers 128 may be located on at least a portion of the middle area MA of the display panel 10. The fourth insulating layers 128 may be spaced apart from each other by a portion of the middle area MA where the groove G is to be formed. The first organic insulating layer 115 may be located on the fourth insulating layers 128. Connection electrodes CM may be arranged on the first organic insulating layer 115, and may be located in at least a portion of the middle area MA. The connection electrodes CM may be spaced apart from each other by the portion of the middle area MA where the groove G is to be formed. Second organic insulating layers 116 may be arranged on the connection electrodes CM. The second organic insulating layers 116 may also be arranged on at least a portion of the middle area MA. The second organic insulating layers 116 may be spaced apart from each other with a portion of the opening area OA where a hole is to be formed interposed with each other. However, the disclosure is not limited thereto.

FIGS. 11 through 14 schematically illustrate operations of forming a sacrificial layer 703 on the middle area MA of the display panel 10.

Referring to FIGS. 11 through 14, the sacrificial layer 703 may be located on the middle area MA. The groove G may be formed in the middle area MA of the display panel 10 by etching the first organic insulating layer 115 and the second organic insulating layers 116 arranged in the middle area MA. The sacrificial layer 703 may be located on the second organic insulating layers 116 to prevent or reduce etching of the first organic insulating layer 115 and the second organic insulating layers 116 excluding the portion of the middle area MA where the groove G is to be formed. Due to the use of the sacrificial layer 703, only the first organic insulating layer 115 and the second organic insulating layers 116 arranged in the portion of the middle area MA where the groove G is to be formed may be etched.

According to some embodiments, the metal layer forming material 701 may be continuously arranged on the peripheral area PA and the middle area MA of the display panel 10. In other words, the metal layer forming material 701 may be continuously coated on the peripheral area PA and the middle area MA of the display panel 10. The metal layer forming material 701 coated on the peripheral area PA may form the metal layer 700 located on the upper surface of the bank 630 and the lateral surface 630IS adjacent to the display area DA among the lateral surfaces of the bank 630. The metal layer forming material 701 located on the middle area MA may form the sacrificial layer 703 located on the middle area MA. In other words, the metal layer forming materials 701 respectively forming the metal layer 700 located on the upper surface of the bank 630 and the lateral surface 630IS adjacent to the display area DA among the lateral surfaces of the bank 630 and the sacrificial layer 703 located on the middle area MA may be coated simultaneously (or concurrently) in the same process. Because the metal layer forming material 701 may be simultaneously (or concurrently) coated not only in the middle area MA of the display panel 10 but also in the peripheral area PA of the display panel 10, the metal layer 700 located in the peripheral area PA may be formed without mask addition. However, embodiments according to the present disclosure are not limited thereto.

According to some embodiments, a first photoresist PR1 may be continuously arranged on the metal layer forming material 701 located on the peripheral area PA and the middle area MA of the display panel 10. In other words, the first photoresist PR1 may be continuously coated on the metal layer forming material 701 located at the peripheral area PA and the middle area MA of the display panel 10. The first photoresist PR1 may be used to form the sacrificial layer 703 on the middle area MA of the display panel 10. A portion of the first photoresist PR1 located on the peripheral area PA and the middle area MA that is located on a portion of the middle area MA where the groove G is to be formed may be removed. In other words, the first photoresist PR1 located at a portion excluding a portion of the middle area MA where the sacrificial layer 703 is to be formed may be removed. Then, the metal layer forming material 701 not covered by the first photoresist PR1 in the middle area MA may be etched. The first photoresist PR1 may protect the metal layer forming material 701 located in the portion where the sacrificial layer 703 is to be formed from being etched. In detail, the metal layer forming material 701 not covered by the first photoresist PR1 in the middle area MA may be wet etched. The first photoresist PR1 may be removed, and thus the sacrificial layer 703 may be formed on the middle area MA.

Figure 15A:
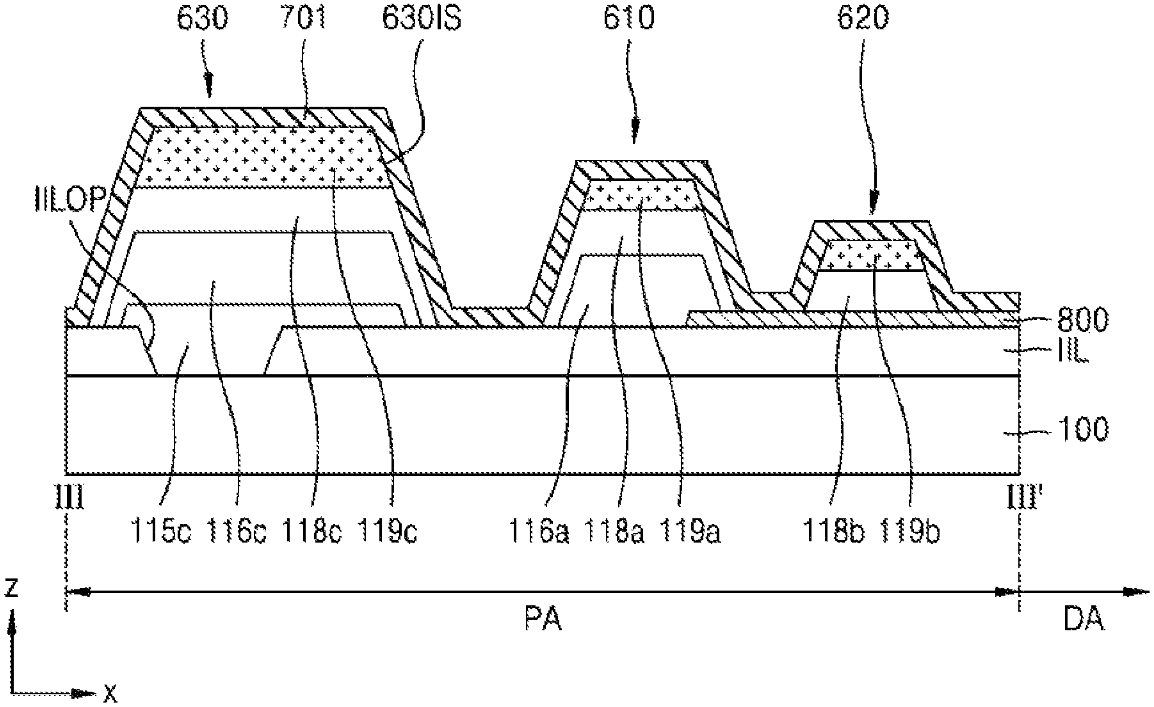
Figure 15B:
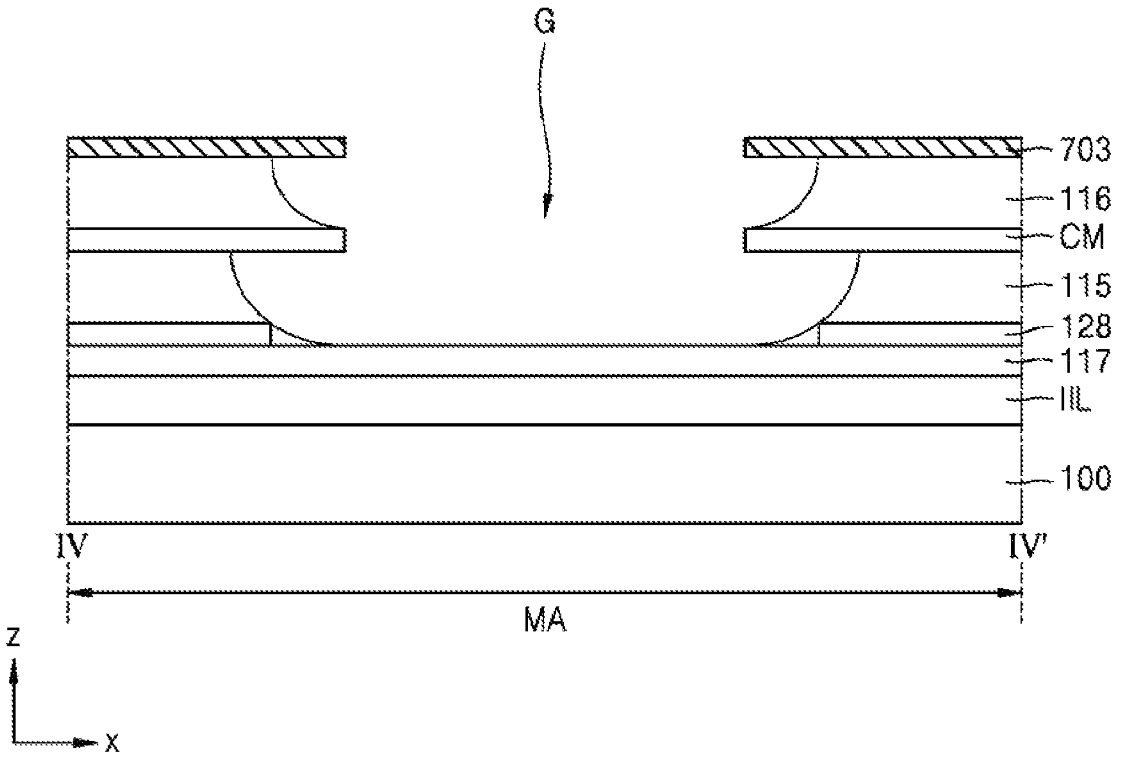
Figure 16A:
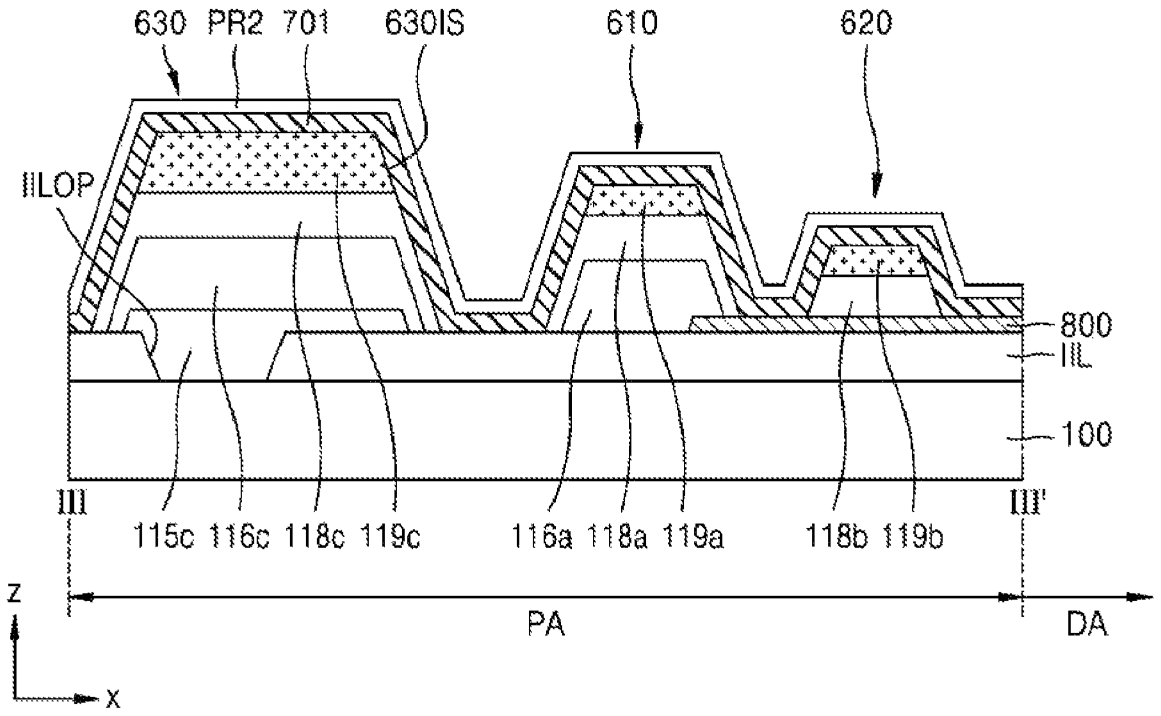
Figure 16B:
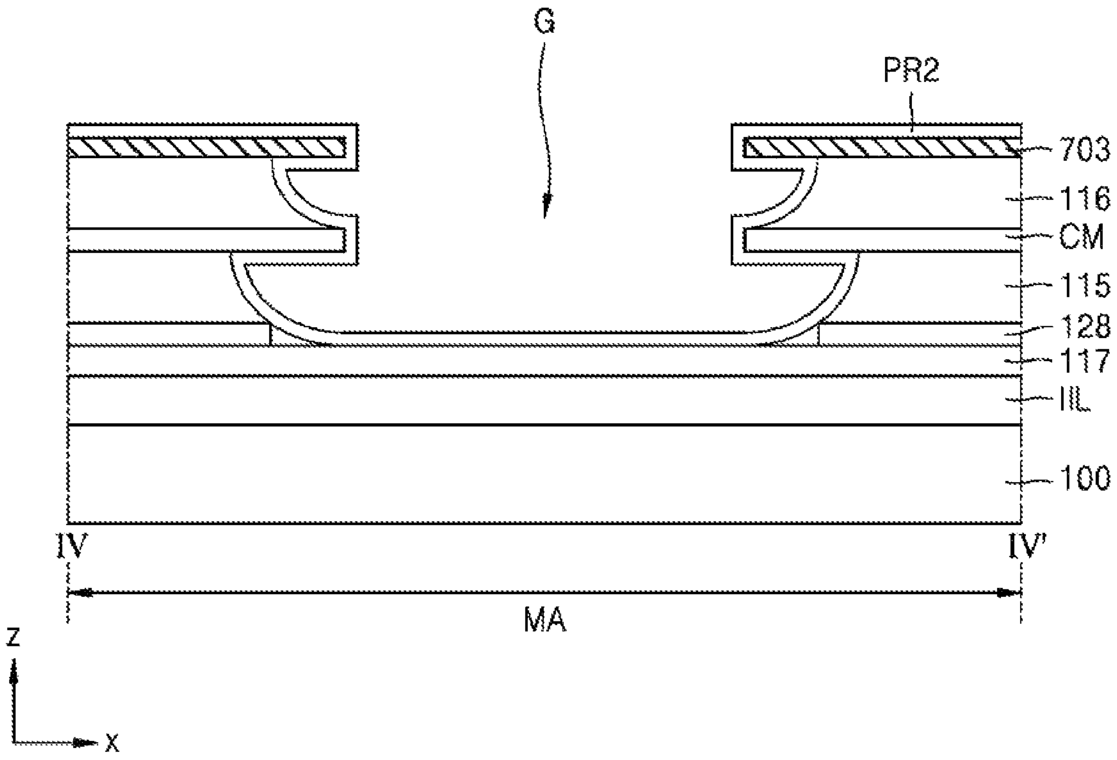
Figure 17A:
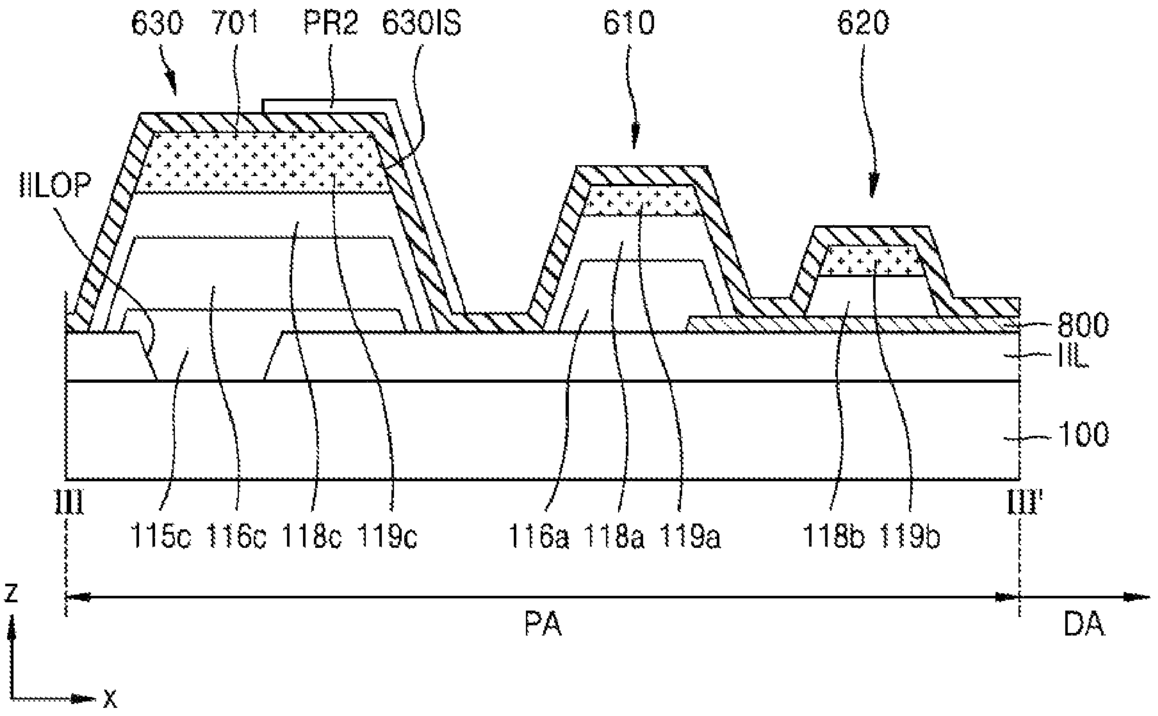
Figure 17B:
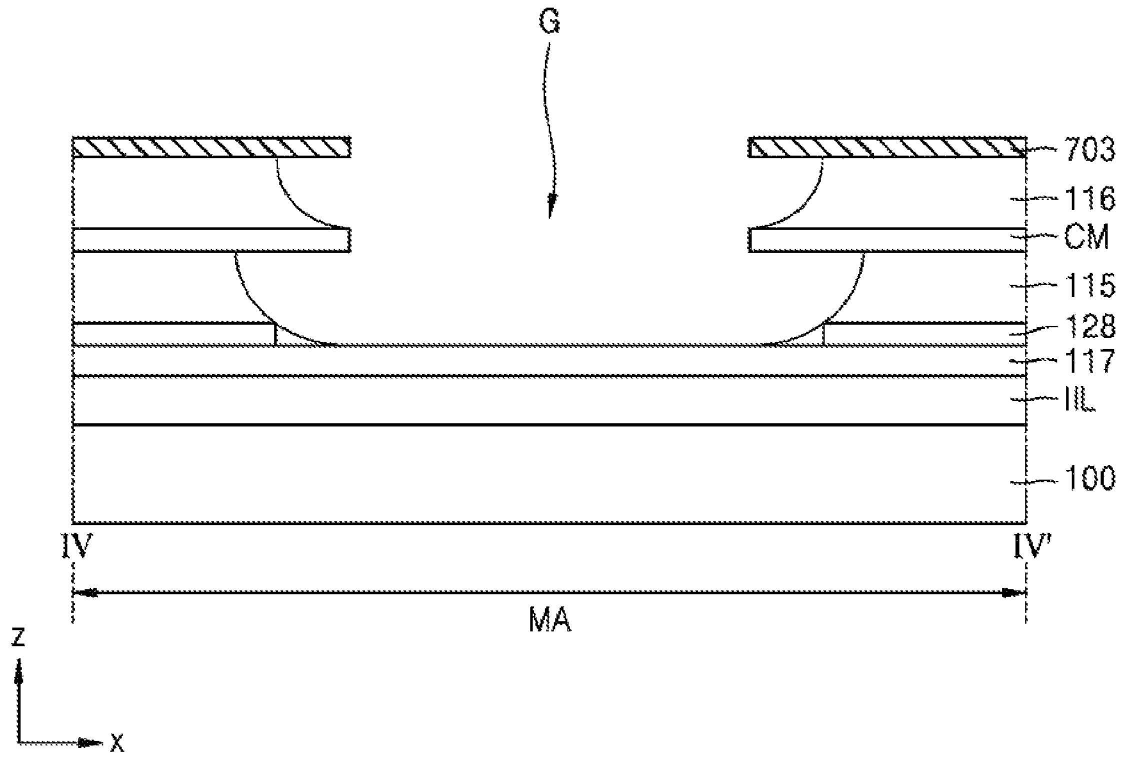
Figure 18A:
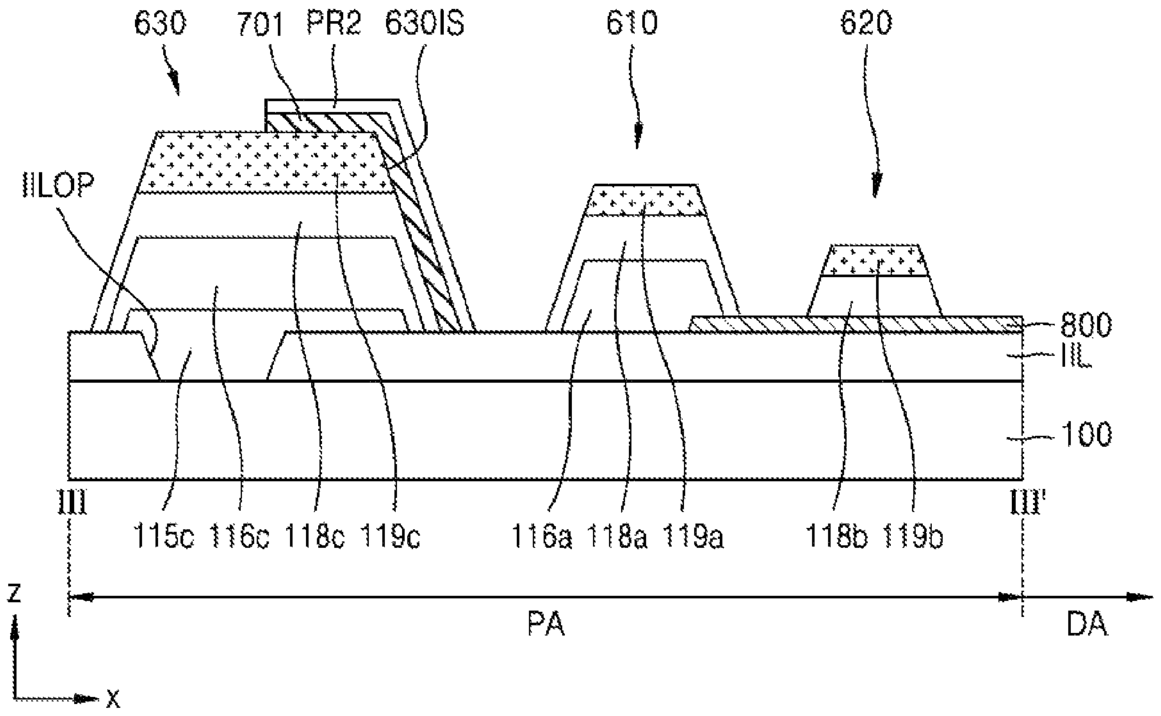
Figure 18B:
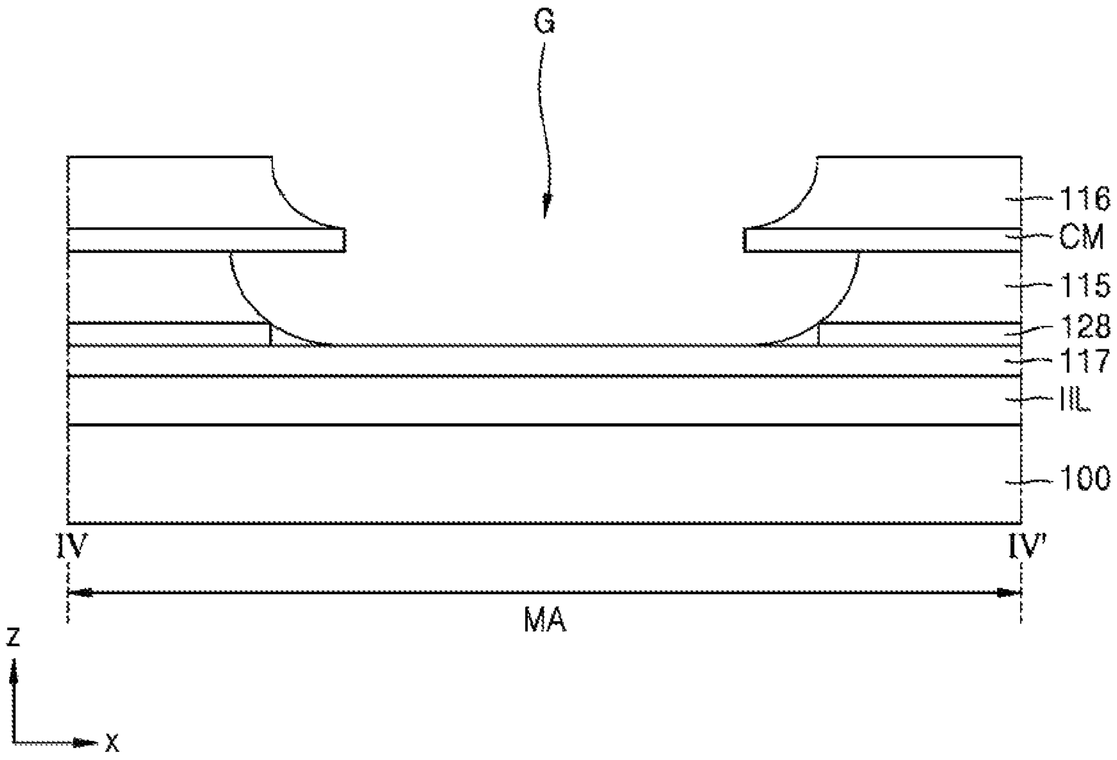

FIGS. 15A and 15B schematically illustrate an operation of forming the groove G in the middle area MA of the display panel 10. Referring to FIGS. 15A and 15B, the groove G may be formed in the middle area MA of the display panel 10. The groove G located at the middle area MA may prevent or recue moisture, oxygen, or other contaminants permeating from the opening area OA to the display area DA. The first organic insulating layer 115 and the second organic insulating layer 116 located in the middle area MA may be etched, and thus the groove G may be formed in the middle area MA. In detail, the groove G of the middle area MA may be formed through dry etching. The sacrificial layer 703 located in the middle area MA may prevent the first organic insulating layer 115 and the second organic insulating layers 1116 arranged in a portion of the middle area MA excluding the groove G from being etched. The protective layer 117 located on the substrate 100 serves as an etch stopper in a process of forming the groove G, and thus may prevent the inorganic insulating layer IIL located below the protective layer 117 and the substrate 100 from being etched. In a typical process for the display panel 10, the sacrificial layer 703 may be removed after the groove G is formed in the middle area MA. However, according to some embodiments, the sacrificial layer 703 may not be removed to form the metal layer 700 on the upper surface of the bank 630 and the lateral surface 630IS adjacent to the display area DA among the lateral surfaces of the bank 630 in the peripheral area PA of the display panel 10. However, the disclosure is not limited thereto.

FIGS. 16 through 19 schematically illustrate an operation of forming the metal layer 700 on at least a portion of the upper surface of the bank 630 and the lateral surface 630IS adjacent to the display area DA among the lateral surfaces of the bank 630 in the peripheral area PA of the display panel 10.

Referring to FIGS. 16A through 19B, a second photoresist PR2 may be continuously arranged on the substrate 100. For example, the second photoresist PR2 may be continuously arranged on an inner surface of the groove G of the middle area MA and the sacrificial layer 703 located on the middle area MA. The second photoresist PR2 may also be continuously arranged on the metal layer forming material 701 located on the peripheral area PA. The second photoresist PR2 may be used to form the metal layer 700 on the upper surface of the bank 630 and the lateral surface 630IS adjacent to the display area DA among the lateral surfaces of the bank 630.

According to some embodiments, the second photoresist PR2 located at a portion of the bank 630 excluding the upper surface of the bank 630 and the lateral surface 630IS adjacent to the display area DA among the lateral surfaces of the bank 630 may be removed. In other words, the second photoresist PR2 located at a portion of the bank 630 excluding a portion thereof where the metal layer 700 is to be formed on the upper surface of the bank 630 and the lateral surface 630IS adjacent to the display area DA among the lateral surfaces of the bank 630 may be removed. The metal layer forming material 701 located at a portion excluding the portion where the second photoresist PR2 is located may be etched. In detail, the metal layer forming material 701 not covered by the second photoresist PR2 may be wet etched. The sacrificial layer 703 located at the middle area MA may also be etched and removed. The second photoresist PR2 may prevent the metal layer forming material 701 located therebelow from being etched.

Figure 19A:
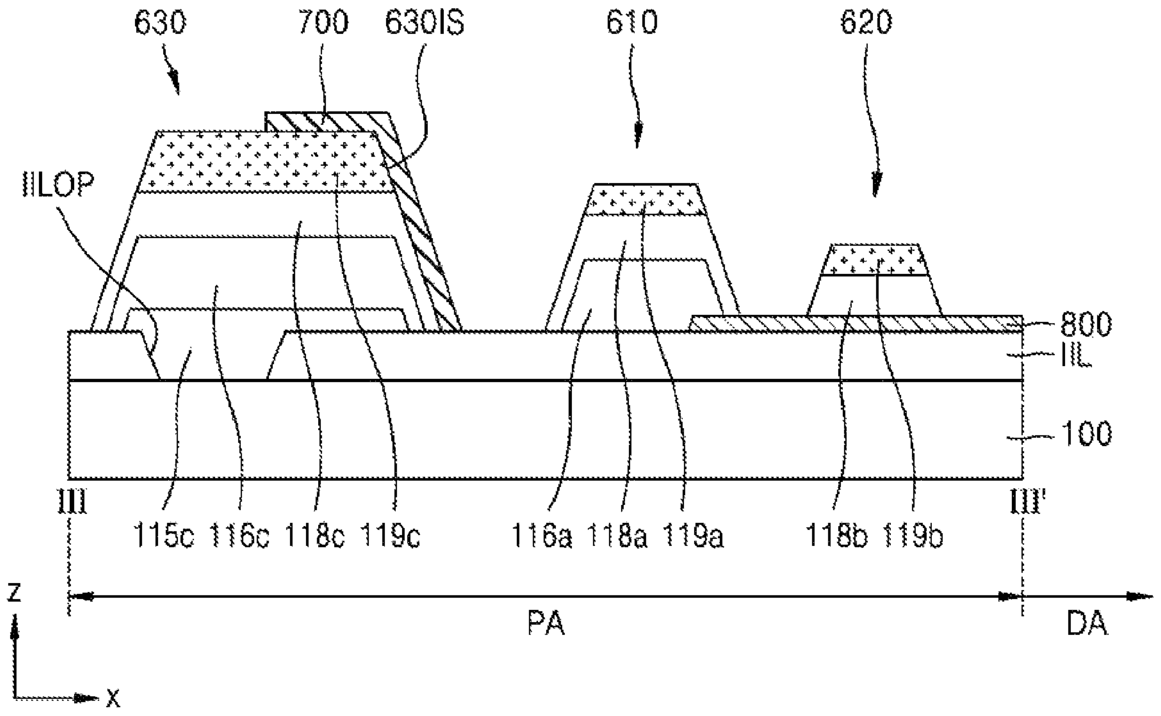
Figure 19B:
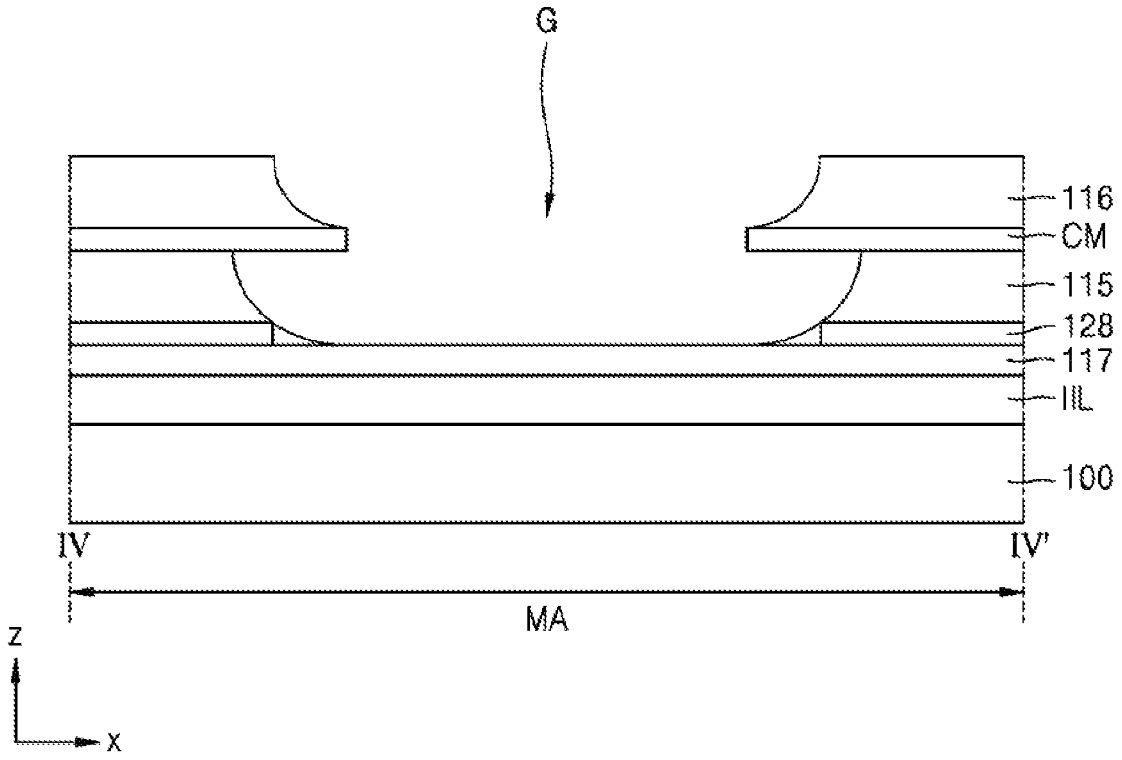

The second photoresist PR2 located on the substrate 100 may be removed. In detail, the second photoresist PR2 located on the upper surface of the bank 630 and the lateral surface 630IS adjacent to the display area DA among the lateral surfaces of the bank 630 may be removed. The metal layer 700 may be formed on the upper surface of the bank 630 and the lateral surface 630IS adjacent to the display area DA among the lateral surfaces of the bank 630. In FIG. 19, the metal layer 700 is formed on the upper surface of the bank 630 and a lateral surface adjacent to the display area DA among the lateral surfaces of the bank 630. However, the disclosure is not limited thereto. The metal layer 700 may extend in a direction toward the display area DA and may be located on the inorganic insulating layer IIL exposed between the bank 630 and the second dam 620.

When reliability of a display panel progresses at high temperature and high humidity, moisture may permeate into a bank located on a peripheral area. The moisture permeating into the bank may expand organic insulating layers that constitute an end of the bank, and may oxidize a first inorganic encapsulation layer located at the end of the bank. The oxidation of the first inorganic encapsulation layer may reduce adhesion between the first inorganic encapsulation layer and an inorganic insulating layer, and the first inorganic encapsulation layer and the inorganic insulating layer may be separated from each other, leading to a damage to the inorganic insulating layer. An electrode located on the inorganic insulating layer may be oxidized due to the damage to the inorganic insulating layer.

In order to prevent oxidation of the electrode located on the inorganic insulating layer, a metal layer may be located on the upper surface of the bank and a lateral surface directed toward a display area among the lateral surfaces of the bank.

While the disclosure has been particularly shown and described with reference to aspects of some embodiments thereof, it will be understood by those of ordinary skill in the art that various changes in form and details may be made therein without departing from the spirit and scope as defined by the following claims.

According to some embodiments as described above, a display panel in which oxidation of at least some of the layers and an electrode included therein is prevented or reduced, and a method of manufacturing the display panel, may be provided. Of course, the scope of the disclosure is not limited thereto.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and their equivalents.

What is claimed is:

1. A display panel comprising:

a substrate comprising a display area, an opening area, a middle area, and a peripheral area outside the display area;

an inorganic insulating layer on the substrate;

a bank on the inorganic insulating layer in the peripheral area; and a metal layer extending along a lateral surface adjacent to the display area among lateral surfaces of the bank and across only on at least a portion of an upper surface of the bank.

2. The display panel of claim 1, further comprising a first dam on the inorganic insulating layer in the peripheral area, wherein the first dam is between the bank and the display area.

3. The display panel of claim 2, further comprising:

a light-emitting diode on the display area; and an encapsulation layer on the light-emitting diode and comprising a first inorganic encapsulation layer, a second inorganic encapsulation layer on the first inorganic encapsulation layer, and an organic encapsulation layer between the first inorganic encapsulation layer and the second inorganic encapsulation layer, wherein the encapsulation layer extends from the display area to the peripheral area.

4. The display panel of claim 3, wherein the organic encapsulation layer is interrupted by the first dam.

5. The display panel of claim 3, wherein the first inorganic encapsulation layer and the second inorganic encapsulation layer are discontinuous on the upper surface of the bank.

6. The display panel of claim 5, wherein respective lengths of the first and second inorganic encapsulation layers on the upper surface of the bank are equal to each other.

7. The display panel of claim 6, wherein a length of the metal layer on the upper surface of the bank is equal to each of the respective lengths of the first and second inorganic encapsulation layers on the upper surface of the bank.

8. The display panel of claim 6, wherein a length of the metal layer on the upper surface of the bank is greater than each of the respective lengths of the first and second inorganic encapsulation layers on the upper surface of the bank.

9. The display panel of claim 2, wherein the metal layer is on at least a portion of the inorganic insulating layer exposed between the bank and the first dam.

10. The display panel of claim 2, wherein a height from an upper surface of the inorganic insulating layer to the upper surface of the bank is greater than a height from the upper surface of the inorganic insulating layer to an upper surface of the first dam.

11. The display panel of claim 1, wherein the metal layer comprises a conductive oxide.

12. The display panel of claim 1, wherein the metal layer comprises a compound of oxygen (O) and at least one of aluminum (Al), titanium (Ti), or tungsten (W).

13. A method of manufacturing a display panel, the method comprising:

preparing for a substrate including a display area, an opening area, a middle area, and a peripheral area outside the display area;

forming an inorganic insulating layer on the substrate;

forming a bank on the inorganic insulating layer;

consecutively covering the substrate with a metal layer forming material; and forming a metal layer extending along a lateral surface adjacent to the display area among lateral surfaces of the bank and across only a portion of an upper surface of the bank.

14. The method of claim 13, further comprising:

forming a sacrificial layer on the middle area by patterning the metal layer forming material, after continuously covering the substrate with the metal layer forming material.

15. The method of claim 14, wherein forming the sacrificial layer on the middle area by patterning the metal layer forming material further comprises:

continuously forming a first photoresist on the metal layer forming material;

removing a portion of the first photoresist located on a portion of the middle area where a groove is to be formed;

etching the metal layer forming material not covered by the first photoresist in the middle area; and forming the sacrificial layer by removing the first photoresist.

16. The method of claim 15, further comprising:

forming the groove by etching a first organic insulating layer and a second organic insulating layer in the middle area, after forming the sacrificial layer on the middle area by patterning the metal layer forming material.

17. The method of claim 13, wherein forming the metal layer on the at least a portion of the upper surface of the bank and the lateral surface adjacent to the display area among the lateral surfaces of the bank comprises:

continuously covering the substrate with a second photoresist;

removing the second photoresist on a portion of the substrate excluding the at least a portion of the upper surface of the bank and the lateral surface adjacent to the display area among the lateral surfaces of the bank;

etching the metal layer forming material not covered with the second photoresist; and removing the second photoresist to form the metal layer.

18. The method of claim 13, wherein the metal layer comprises a conductive oxide.

19. The method of claim 13, wherein the metal layer comprises a compound of oxygen (O) and at least one of aluminum (Al), titanium (Ti), or tungsten (W).

20. The method of claim 13, wherein forming the bank on the inorganic insulating layer may include forming the bank by patterning a first organic insulating layer, a second organic insulating layer, a pixel defining layer, or a spacer on the inorganic insulating layer.

* * * * *